(12) United States Patent
Foster et al.

(10) Patent No.: US 7,893,798 B2
(45) Date of Patent: Feb. 22, 2011

(54) DUAL SUBSTRATE MEMS PLATE SWITCH AND METHOD OF MANUFACTURE

(75) Inventors: John S. Foster, Santa Barbara, CA (US); Kimberly L. Turner, Goleta, CA (US)

(73) Assignee: Innovative Micro Technology, Goleta, CA (US)

( * ) Notice: Subject to any disclaimer, the term of this patent is extended or adjusted under 35 U.S.C. 154(b) by 691 days.

(21) Appl. No.: 11/797,924

(22) Filed: May 9, 2007

(65) Prior Publication Data

US 2008/0278268 A1 Nov. 13, 2008

(51) Int. Cl.
*H01H 51/22* (2006.01)

(52) U.S. Cl. .......................................... 335/78; 200/181

(58) Field of Classification Search ................... 335/78; 200/181

See application file for complete search history.

(56) References Cited

U.S. PATENT DOCUMENTS

| | | | |
|---|---|---|---|
| 6,124,650 A * | 9/2000 | Bishop et al. | 310/40 MM |
| 6,384,353 B1 * | 5/2002 | Huang et al. | 200/181 |
| 6,396,372 B1 | 5/2002 | Sakata et al. | |
| 6,486,425 B2 | 11/2002 | Seki | |
| 6,621,135 B1 * | 9/2003 | Sridhar et al. | 257/415 |
| 6,734,513 B2 * | 5/2004 | Seki et al. | 257/422 |
| 6,872,902 B2 * | 3/2005 | Cohn et al. | 200/181 |
| 7,008,812 B1 | 3/2006 | Carley | |
| 7,119,943 B2 | 10/2006 | Nelson et al. | |
| 7,551,048 B2 * | 6/2009 | Iwata et al. | 335/78 |
| 2006/0286707 A1 | 12/2006 | Hooper et al. | |
| 2006/0286796 A1 | 12/2006 | Salian et al. | |

* cited by examiner

*Primary Examiner*—Anh T Mai
*Assistant Examiner*—Bernard Rojas
(74) *Attorney, Agent, or Firm*—Jaquelin K. Spong

(57) ABSTRACT

Systems and methods for forming an electrostatic MEMS plate switch include forming a deformable plate on a first substrate, forming the electrical contacts on a second substrate, and coupling the two substrates using a hermetic seal. The deformable plate may have at least one shunt bar located at a nodal line of a vibrational mode of the deformable plate, so that the shunt bar remains relatively stationary when the plate is vibrating in that vibrational mode. The hermetic seal may be a gold/indium alloy, formed by heating a layer of indium plated over a layer of gold. Electrical access to the electrostatic MEMS switch may be made by forming vias through the thickness of the second substrate.

23 Claims, 16 Drawing Sheets

DUAL SUBSTRATE MEMS PLATE SWITCH AND METHOD OF MANUFACTURE

STATEMENT REGARDING FEDERALLY SPONSORED RESEARCH

Portions of the present invention were made with U.S. Government support under NSF SBIR Grant No. 0637474. The government may have certain rights in this invention.

CROSS REFERENCE TO RELATED APPLICATIONS

This U.S. patent application is related to U.S. patent application Ser. No. 11/211,623, filed Aug. 26, 2005 and incorporated by reference herein in its entirety.

STATEMENT REGARDING MICROFICHE APPENDIX

Not applicable.

BACKGROUND

This invention relates to a microelectromechanical systems (MEMS) switch device, and its method of manufacture. More particularly, this invention relates to a MEMS electrostatic plate switch, which is manufactured on two separate substrates.

Microelectromechanical systems are devices often having moveable components which are manufactured using lithographic fabrication processes developed for producing semiconductor electronic devices. Because the manufacturing processes are lithographic, MEMS devices may be made in very small sizes, and in large quantities. MEMS techniques have been used to manufacture a wide variety of sensors and actuators, such as accelerometers and electrostatic cantilevers.

MEMS techniques have also been used to manufacture electrical relays or switches of small size, generally using an electrostatic actuation means to activate the switch. MEMS devices often make use of silicon-on-insulator (SOI) wafers, which are a relatively thick silicon "handle" wafer with a thin silicon dioxide insulating layer, followed by a relatively thin silicon "device" layer. In the MEMS devices, a thin cantilevered beam of silicon may be etched into the silicon device layer, and a cavity is created adjacent to the thin beam, typically by etching the thin silicon dioxide layer below it to allow for the electrostatic deflection of the beam. Electrodes provided above or below the beam may provide the voltage potential which produces the attractive (or repulsive) force to the cantilevered beam, causing it to deflect within the cavity.

One known embodiment of such an electrostatic relay is disclosed in U.S. Pat. No. 6,486,425 to Seki. The electrostatic relay described in this patent includes a fixed substrate having a fixed terminal on its upper surface and a moveable substrate having a moveable terminal on its lower surface. Upon applying a voltage between the moveable electrode and the fixed electrode, the moveable substrate is attracted to the fixed substrate such that an electrode provided on the moveable substrate contacts another electrode provided on the fixed substrate to close the microrelay.

However, to fabricate the microrelay described in U.S. Pat. No. 6,486,425, the upper substrate must be moveable, so that the upper substrate must be thin enough such that the electrostatic force may cause it to deflect. The moveable substrate is formed from a silicon-on-insulator (SOI) wafer, wherein the moveable feature is formed in the silicon device layer, and the SOI wafer is then adhered to the fixed substrate. The silicon handle wafer and silicon dioxide insulating layer are then removed from the SOI wafer, leaving only the thin silicon device layer which forms the moveable structure.

SUMMARY

Because the top substrate of the microrelay described in the '425 patent must necessarily be thin enough to be moveable, it is also delicate and susceptible to damage from contact during or after fabrication.

The systems and methods described here form an electrostatic MEMS plate switch using dual substrates, a first, lower substrate on which to form a deformable plate with at least one electrical shunt bar to provide an electrical connection between two contacts of a switch. These contacts may be formed on a second, upper substrate. After forming these structures, the two substrates are bonded together to form the switch. It should be understood that the designation of "upper" and "lower" is arbitrary, that is, the deformable plate may also be formed on an upper substrate and the contacts may be formed on a lower substrate.

The electrostatic MEMS plate design may have a number of advantages over cantilevered switch designs. For example, in a plate design, the stiffness of the restoring force on the plate may no longer be determined by the plate dimensions, but instead may be determined by spring beams which support the deformable plate over the substrate surface. Therefore, weaker or stronger restoring forces may be used without impacting the plate dimensions. This may allow the spacing of the contacts of the switch to be larger, or smaller, than that of the cantilever design without affecting the stiffness of the moveable structure. Because the restoring force is provided by spring beams, the device may be made more compact than the cantilevered designs, which may require a certain length of cantilevered beam to provide sufficient flexibility. Also, multiple switches may be placed on a single deformable plate, whereas with the cantilevered design, only the area at the distal end of the cantilevered beam is generally appropriate for the placement of the switch.

Accordingly, in the systems and methods described here, the deformable plate is attached to the first SOI substrate by one or more narrow spring beams formed in the device layer of the SOI substrate. These spring beams remain fixed at their proximal ends to the silicon dioxide and handle layer of the SOI substrate. A portion of the silicon dioxide layer adjacent to the deformable plate may be etched to release the plate, however, a silicon dioxide attachment point remains which couples the spring beams supporting the deformable plate to the silicon handle layer. The silicon dioxide layer therefore provides the anchor point for adhesion of the deformable plate to the first, lower SOI substrate from which it was made. Because the remainder of the rigid, SOI wafer remains intact, it may provide protection for the switch against inadvertent contact and shock.

Because the rigid SOI wafer remains intact, it may also be hermetically bonded to a second, upper substrate at the end of the fabrication process. By forming the hermetic seal, the switch may enclose a particular gas environment which may be chosen to increase the breakdown voltage of the gas environment within the switch. Alternatively, the environment surrounding the plate switch may be vacuum, which may increase the switching speed of the plate switch by decreasing viscous squeeze film damping which may arise in a gas environment. The hermetic seal may also protect the electrostatic MEMS switch from ambient dust and debris, which may otherwise interfere with the proper functioning of the device.

The deformable plate formed on the first substrate may carry one or more shunt bars, placed at or near the nodal lines for a vibrational mode of the deformable plate. Points along these lines remain relatively stationary, even though the deformable plate may still be vibrating in the vibrational mode. In one exemplary embodiment, the deformable plate may carry two shunt bars, each placed on a nodal line for a particular vibrational mode of the deformable plate known as the (2,0) mode, hereinafter called the third mode. This mode is well known to those well versed in the art of plate modes. By placing the shunt bars in these locations along nodal lines, the switch is relatively insensitive to continuing vibrations, and the switch may remain closed even when the deformable plate is still moving.

In one exemplary embodiment, the deformable plate is coupled to the first, SOI substrate by four flexible spring beams which are anchored to the dielectric layer of the SOI substrate at the proximal end of each spring beam. The other end of the spring beams may be contiguous with the deformable plate. The spring beams may include a substantially ninety degree bend, so that each spring beam on one side of the deformable plate extends in an opposite direction from the other. This embodiment may be referred to as the symmetric embodiment, as the two spring beams on each side of the deformable plate may have the same shapes and orientations as the two spring beams on the other side of the deformable plate. In another "asymmetric" embodiment, the spring beams on one side of the deformable plate may extend in one direction, and the spring beams on the other side of the deformable plate may extend in the opposite direction. The asymmetric embodiment may therefore be capable of twisting during vibration, which may provide a scrubbing action to the deformable plate. The scrubbing action may clear contamination and debris, thus reducing the contact resistance between the shunt bars on the deformable plate and the contacts located on the second substrate.

In one exemplary embodiment, etch release holes may be placed between the nodal lines of the deformable plate, so that the deformable plate may be made more flexible in critical regions. The etch release holes may thereby encourage vibration in a particular vibrational mode over vibrations in other modes. In other exemplary embodiments, the etch release holes may be placed uniformly about the deformable plate in a close-packed hexagonal array. This arrangement may reduce the mass of the deformable plate, and allow ambient gas to flow through the etch release holes and thus reducing squeeze film damping and increasing the switching speed of the deformable plate.

In one exemplary embodiment, the method for manufacturing the MEMS switch may include forming a deformable plate on a first substrate, forming at least one electrode on a second substrate, and coupling the first substrate to the second substrate with a seal that encloses the MEMS switch. By forming these features on separate substrates, the cleanliness of the contact points may be maintained during processing, before the substrates are sealed hermetically.

The seal may be hermetic, made by forming an alloy of gold and indium, $AuIn_x$, where x is about 2. The alloy may be formed by melting a layer of indium deposited over a layer of gold. The hermetic seal is therefore also conductive, and may provide electrical access to the deformable plate, for example. The hermetic seal may be particularly important for switching applications involving relatively high voltage signals, wherein an insulating gas may be needed to prevent electrical breakdown of the environment between the high voltage electrodes. In such cases, the insulating gas, or vacuum, may need to be sealed hermetically to create an environment for the MEMS switch which can withstand higher voltages without breaking down, without allowing the gas to leak out of, or into, the MEMS switch seal.

In another exemplary embodiment, electrical access to the switch may be gained using through hole vias formed through the second substrate. By providing electrical access through the second substrate, the hermetic seal may not be compromised by the presence of electrical leads being routed under the bond line.

The systems and methods described herein may be appropriate for the fabrication of an RF electrostatic MEMS plate switch which is capable of operating in the range of DC to 10 GHz.

These and other features and advantages are described in, or are apparent from, the following detailed description.

BRIEF DESCRIPTION OF THE DRAWINGS

Various exemplary details are described with reference to the accompanying drawings, which however, should not be taken to limit the invention to the specific embodiments shown but are for explanation and understanding only.

DETAILED DESCRIPTION

In the systems and methods described here, an electrostatic MEMS switch is fabricated on two substrates. A deformable plate carrying at least one shunt bar is formed on the first substrate, and the electrical contacts of the switch, which will be connected via the shunt bar on the deformable plate when the switch is closed, are formed on the other substrate. The two substrates may then be sealed hermetically by a gold-indium seal. Electrical access to the switch may be afforded by a set of through hole vias, which extend through the thickness of the second substrate. Although the systems and methods are described as forming the deformable plate first on the first substrate followed by the electrical contacts on the second substrate, it should be understood that this embodiment is exemplary only, and that the electrical contacts may be formed first, or in parallel with, the formation of the deformable plate.

Figure 1:
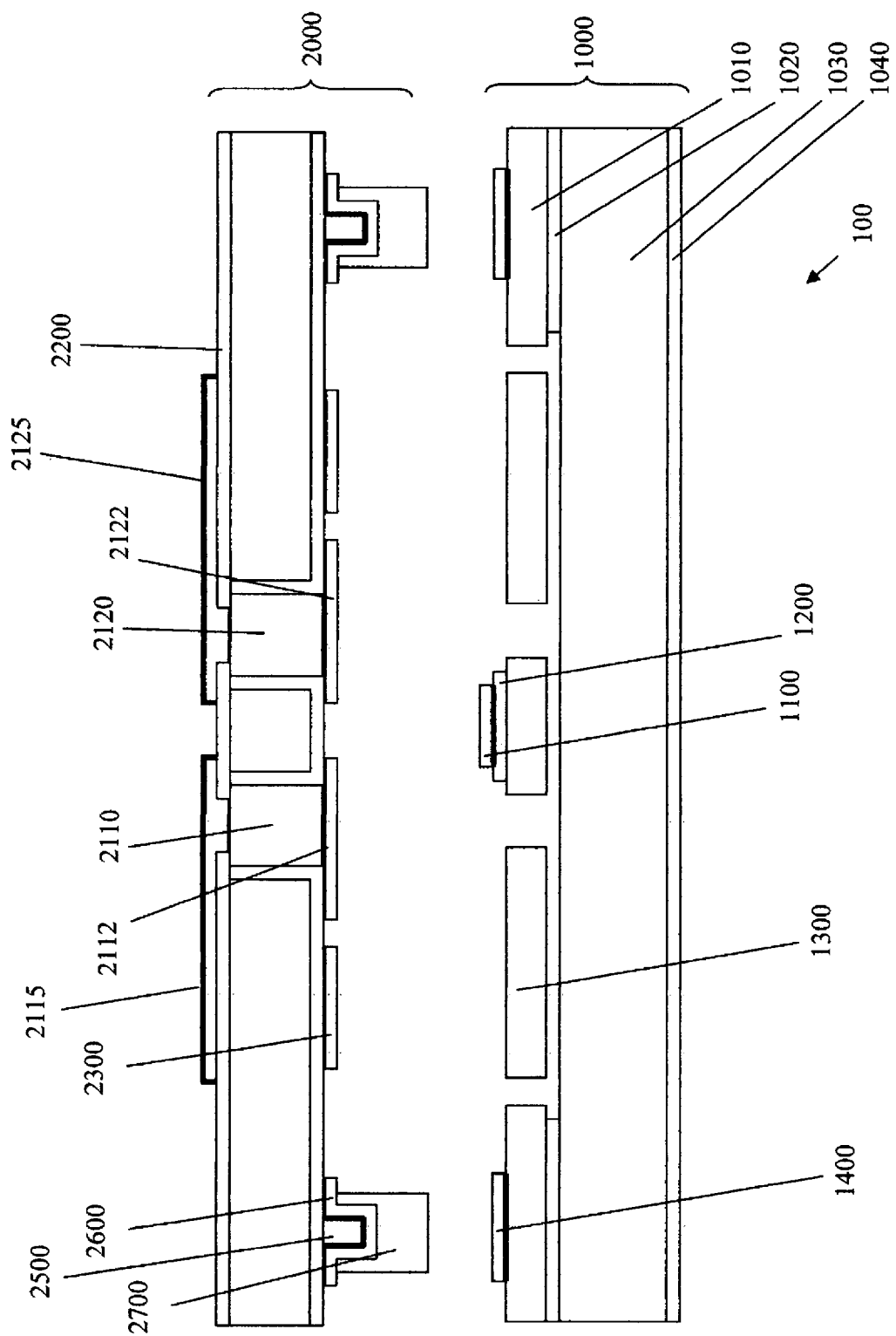
FIG. 1 is a cross sectional view of an exemplary dual substrate electrostatic MEMS plate switch.

FIG. 1 is a cross sectional view of the dual substrate electrostatic MEMS plate switch 100 fabricated on two substrates, a plate substrate 1000 and a via substrate 2000. The plate substrate 1000 may be an SOI wafer, and the via substrate may be a silicon wafer. The switch 100 may include a plate 1300 bearing at least one shunt bar 1100. The plate may be deformable, meaning that it is sufficiently thin compared to its length or its width to be deflected when a force is applied, and may vibrate in response to an impact. For example, a deformable plate may deflect by at least about 10 nm at its center by a force of about 1 μNewton applied at the center, and sufficiently elastic to support vibration in a plurality of vibrational modes. The deformable plate 1300 may be suspended above the handle layer 1030 of an SOI substrate by four spring beams (not shown in FIG. 1), which are themselves affixed to the handle layer 1030 by anchor points formed from the dielectric layer 1020 of the SOI plate substrate 1000. As used herein, the term "spring beam" should be understood to mean a beam of flexible material affixed to a substrate at a proximal end, and formed in substantially one plane, but configured to move and provide a restoring force in a direction substantially perpendicular to that plane. The deformable plate may carry at least one, and preferably two conductive shunt bars which operate to close the switch 100, as described below.

Each shunt bar is designed to span two contact points, 2110 and 2120, which are through wafer vias formed in the via substrate 2000, and covered by a layer of contact material 2112 and 2122, respectively. The deformable plate may be actuated electrostatically by an adjacent-electrostatic-electrode 2300, which may be disposed directly above (or below) the deformable plate 1300, and may be fabricated on the via substrate 2000. The deformable plate 1300 itself may form one plate of a parallel plate capacitor, with the electrostatic electrode 2300 forming the other plate. When a differential voltage is placed on the deformable plate 1300 relative to the adjacent electrostatic electrode 2300, the deformable plate is drawn toward the adjacent electrostatic electrode 2300. The action raises (or lowers) the shunt bar 1100 into a position where it contacts the contact points 2110 and 2120, thereby closing an electrical circuit. Although the embodiment illustrated in FIG. 1 shows the plate formed on the lower substrate and the vias and contacts formed on the upper substrate, it should be understood that the designation "upper" and "lower" is arbitrary. The deformable plate may be formed on either the upper substrate or lower substrate, and the vias and contacts formed on the other substrate. However, for the purposes of the description which follows, the embodiment shown in FIG. 1 is presented as an example, wherein the plate is formed on the lower substrate and is pulled upward by the adjacent electrode formed on the upper substrate.

Figure 2:
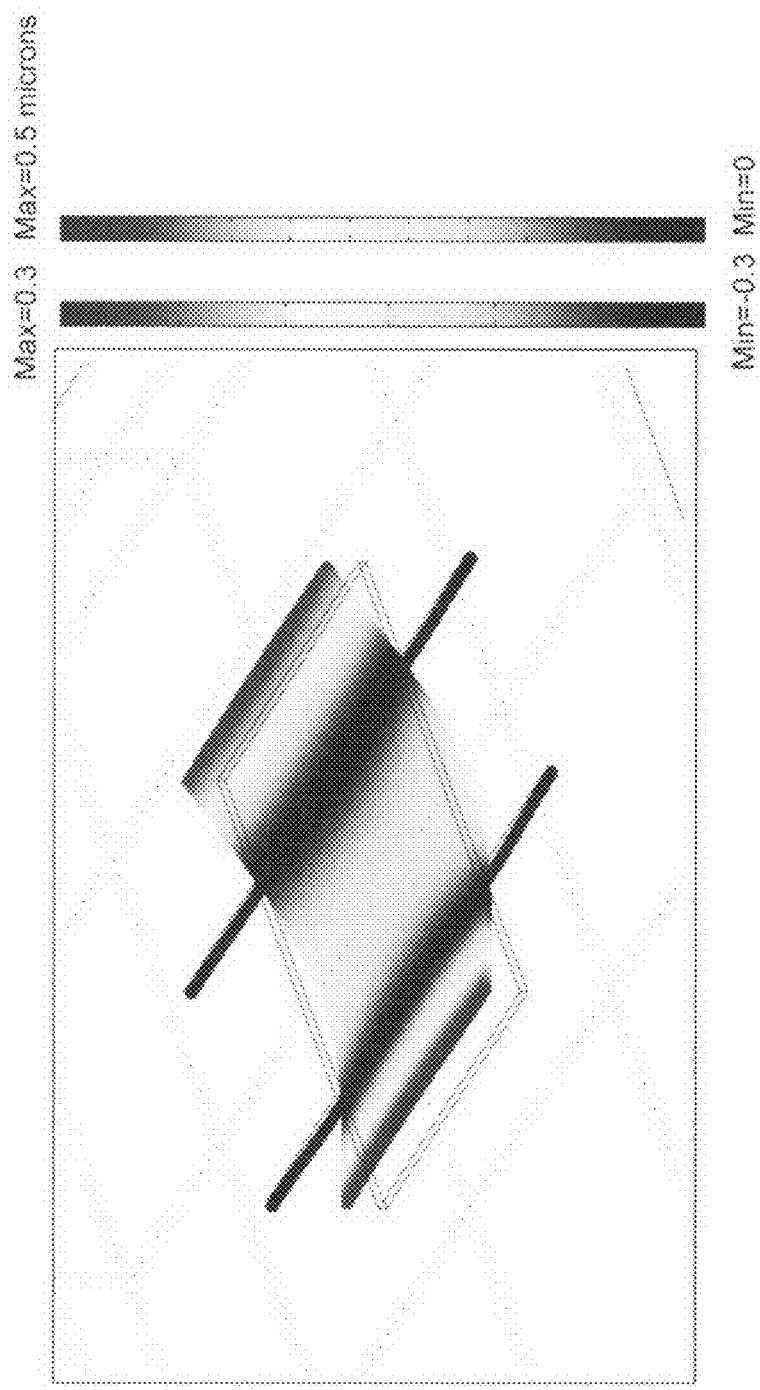
FIG. 2 is a greyscale image of the third vibrational mode of a deformable plate such as that used in the plate switch of FIG. 1.

FIG. 2 is a greyscale image of a thin, deformable plate in a vibrational mode. The image was generated by a finite element model, using plate dimensions of 200 μm width by 300 μm length by 5 μm thickness. The deformable plate is supported by four spring beams 10 μm wide and 5 μm thick, extending from two sides of the deformable plate. According to the model, a first vibrational mode with a frequency of 73 kHz may be simply the movement of the entire plate, substantially undeflected, toward and away from the surface to which it is attached by the spring beams. A second vibrational mode with a frequency of 171 kHz occurs when the deformable plate twists about its long axis, by bending at the joints between the deformable plate and the spring beams.

However, another vibrational mode exists as illustrated by FIG. 2, which is encouraged by the proper placement of the spring beams. The spring beams are placed at approximately the location of the node lines for this vibrational mode. By placing the spring beams at these points, the plate may vibrate with relatively little deflection of the spring beams. The frequency associated with this mode is at about 294 kHz.

As a result, the deformable plate vibrates substantially in the third vibrational mode, with the node lines of the vibration located substantially at the locations of the supporting spring beams. These node lines indicate points on the deformable plate which remain relatively stationary, compared to the ends and central region which are deflected during the vibration. The existence of these node lines indicate advantageous locations for the placement of electrodes for a switch, because even when the plate is vibrating, there is relatively little deflection of the plate along the node lines. Accordingly, if a shunt bar is placed at the node lines, the shunt bar may provide electrical conductivity between two electrodes located beneath the shunt bar, even if the plate continues to vibrate.

Figure 3:
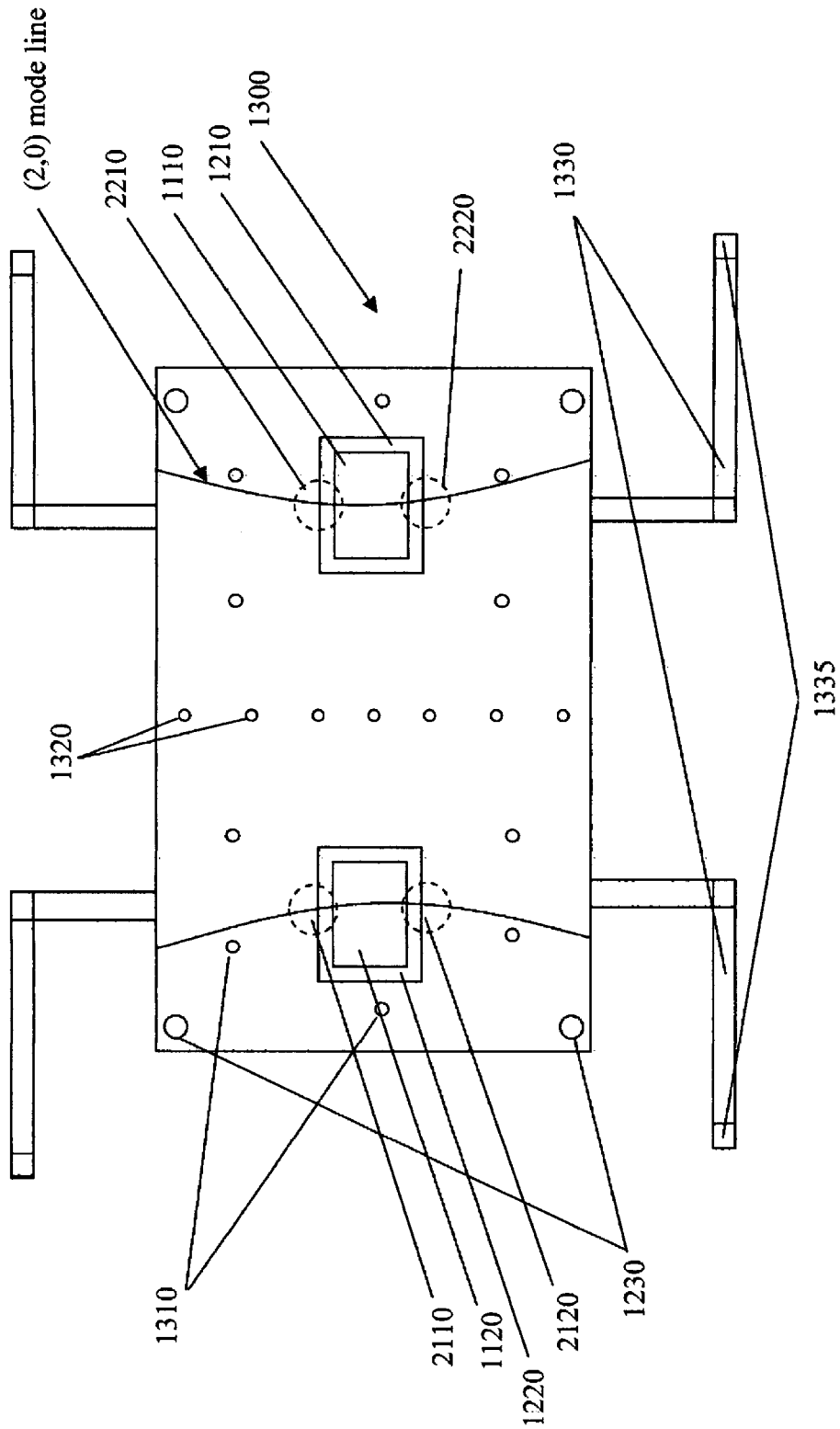
FIG. 3 is a plan view of one exemplary embodiment of the deformable plate of the dual substrate electrostatic MEMS plate switch of FIG. 1, showing the locations of the two shunt bars along the nodal lines of the deformable plate.

FIG. 3 is a plan view of a first exemplary embodiment of a deformable plate useable in the plate switch of FIG. 1. The plate is supported by four spring beams 1330, which are attached to the underlying substrate at their proximal ends 1335. One pair of the four spring beams may be disposed on one side of the deformable plate, and another pair of the four spring beams may be disposed on an opposite side of the deformable plate. Each spring beam may have a segment extending from the deformable plate which is coupled to an adjoining segment by a bend. The choice of angle for this bend may affect the kinematics of the deformable plate 1300.

In the embodiment shown in FIG. 3, the spring beams include a ninety degree bend, such that each spring beam on each side of the deformable plate 1300 extends in an opposite direction to the adjacent spring beam. This embodiment may be referred to as the symmetric embodiment, as the orientation of the deformable plate and spring beams is symmetric with respect to reflection across either a longitudinal or latitudinal axis of the deformable plate, wherein the longitudinal or latitudinal axis is defined as horizontal or vertical line, respectively, passing through the center of the deformable plate. It should be understood that this embodiment is exemplary only, and that the spring beams may bend with other angles, for example, twenty or thirty degrees, rather than ninety as shown in FIG. 3.

The two nodal lines for the third vibrational mode are shown in FIG. 3. One of two shunt bars 1110 and 1120 may be placed across each nodal line. The shunt bars 1110 and 1120 may be electrically isolated from the deformable plate by a layer of dielectric 1210 and 1220, respectively. Additional dielectric standoffs 1230 may be formed at the corners of deformable plate 1300, to prevent deformable plate 1300 from contacting the adjacent electrostatic electrode 2300 at the corners of deformable plate 1300, when actuated by the adjacent electrostatic electrode 2300. The shunt bars 1110 and 1120 may be dimensioned appropriately to span the distance between two underlying electrical contacts, 2110 and 2120 under shunt bar 1110, and contacts 2210 and 2220 under shunt bar 1120. The deformable plate 1300 is actuated when a voltage differential is applied to an adjacent electrode, which pulls the deformable plate 1300 toward the adjacent electrode. If the deformable plate 1300 vibrates as a result of actuation, it is likely to vibrate in the third vibrational mode shown in FIG. 2. Accordingly, the shunt bars 1110 and 1120 are placed advantageously at the nodal lines of this vibrational mode.

The tendency of deformable plate 1300 to vibrate in the third vibrational mode may be enhanced by placing etch release holes 1320 along the latitudinal axis passing through the center of the deformable plate, between the nodal lines, as shown in FIG. 3. These etch release holes are used to assist the liquid etchant in accessing the far recessed regions beneath the deformable plate, to remove the dielectric layer beneath the plate, as described further in the exemplary manufacturing process set forth below. By placing these etch release holes appropriately, the deformable plate 1300 may be made more flexible in certain regions, such as along the latitudinal axis, such that the plate is encouraged to vibrate in a mode such that the maximum deflection occurs where the plate is more flexible. For example, to encourage the vibration as shown in FIG. 2, the plate may be made more flexible along its latitudinal axis, in order to accommodate the regions undergoing the maximum deflection, by placing etch release holes 1320 along this latitudinal axis.

In another alternative embodiment, the etch release holes are disposed in a close-packed hexagonal array over the entire surface of the deformable plate 1300. Such an embodiment may be advantageous in that the mass of the deformable plate is reduced, and multiple pathways are provided for the flow of the ambient gas to either side of the deformable plate. Both of these effects may improve the switching speed of the device by reducing the inertia of the deformable plate 1300 and reducing the effects of squeeze film damping.

Figure 4:
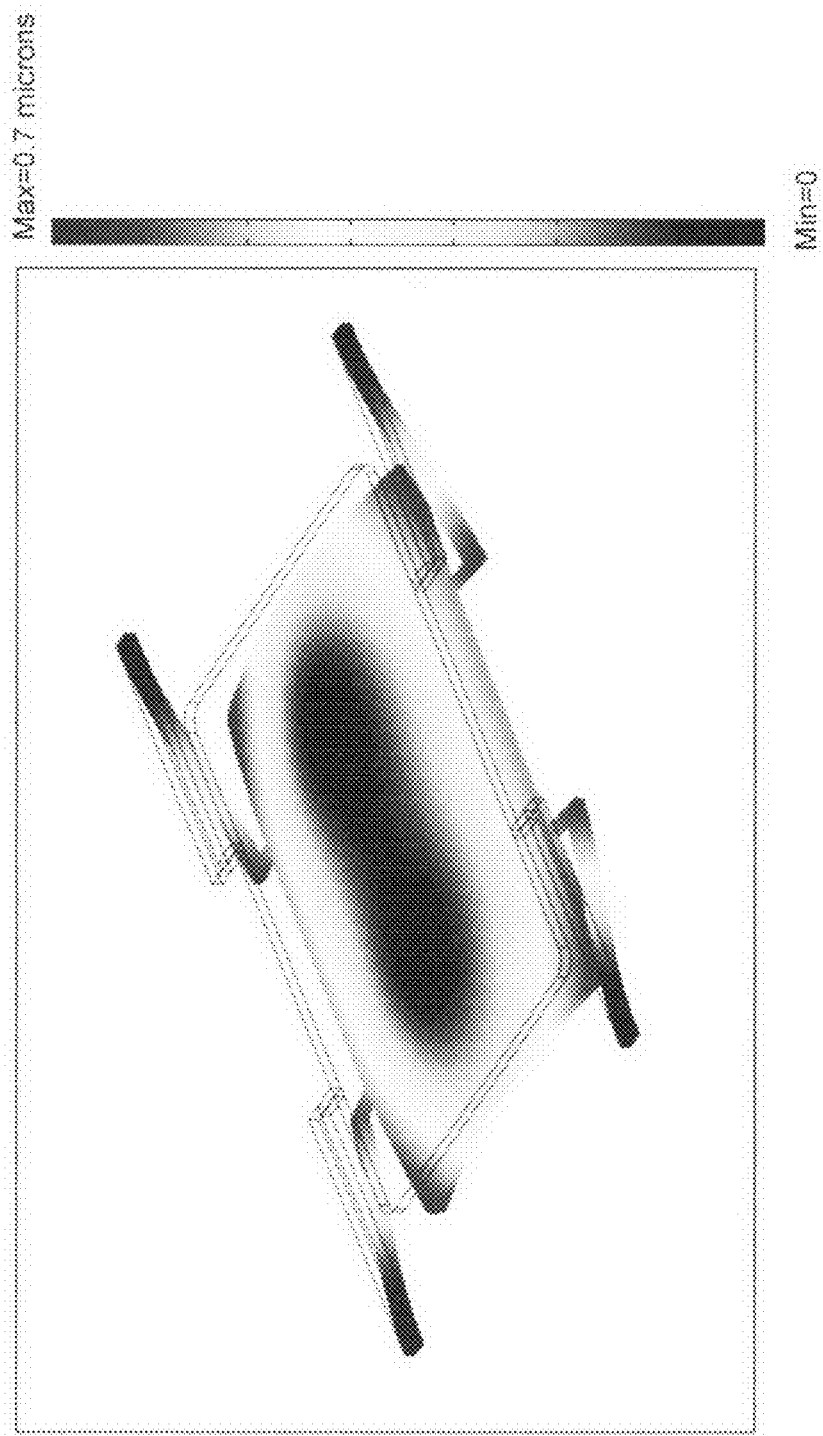
FIG. 4 is a greyscale image of the deformable plate in the third vibrational mode upon making contact with electrodes located below the shunt bars.

FIG. 4 is a greyscale image of the deformable plate shown in FIG. 3, after actuation by an adjacent electrode, calculated by a finite element model. As shown in FIG. 4, the deformable plate is pulled down toward the adjacent electrode, which in this case is located beneath the deformable plate 1300. The lowest areas of the deformed plate are in the vicinity of the contacts, also located beneath the deformable plate 1300. When the deformable plate is deflected as shown in FIG. 4, the shunt bars affixed to the deformable plate are lowered onto the underlying contacts, thus providing a conductive path between the contacts and closing the switch 100. Any residual vibration in the deformable plate is primarily in the third vibrational mode, depicted in FIG. 2. Thus, for shunt bars placed as shown in FIG. 3, the residual vibration does not substantially affect the ability of switch 100 to close the conductive path between the contacts.

Also as shown in FIG. 4, the corners of deformable plate 1300 tend to be drawn towards the adjacent actuation electrode. The dielectric standoffs 1230 may prevent the touching of corners of the deformable plate 1300 to the adjacent electrode, thus shorting the actuation voltage. The actuation voltage in this simulation is about 40 volts, and the size of the deformable plate is about 200 μm by 300 μm. This actuation voltage produces a deflection of at least about 0.6 μm in the deformable plate. This deflection is about ⅓ of the overall separation between the shunt bars and the electrodes, which may nominally be about 2.5 μm, and is sufficient to cause snap-down of the deformable plate onto the underlying contacts. Although as shown in FIG. 4, the maximum deflection is near the center of the plate, this effect may be altered by disposing the spring beams at an angle shallower than ninety degrees. Such an arrangement may result in a more consistent force being applied between the shunt bar and each of the underlying contacts.

Figure 5:
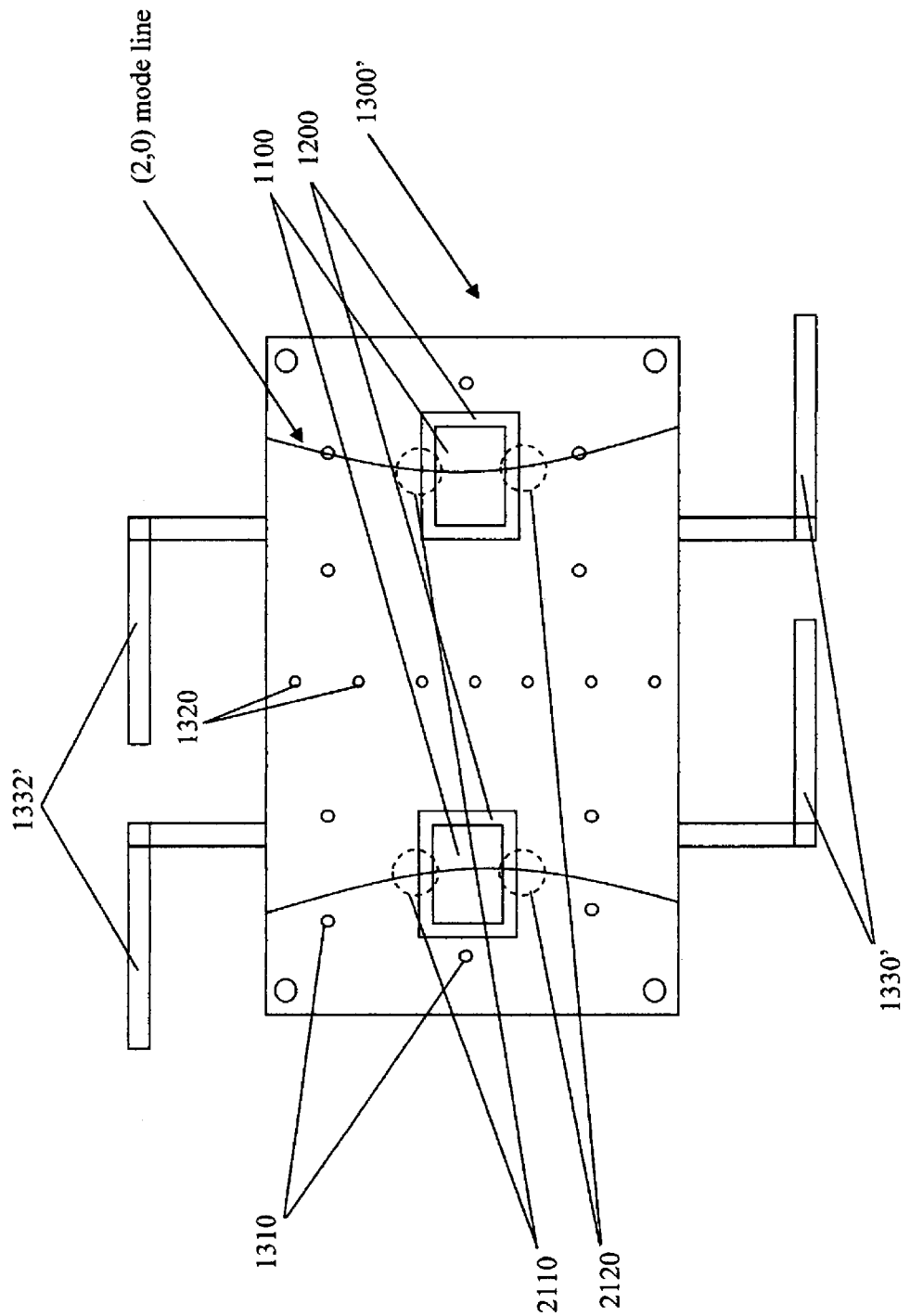
FIG. 5 is a plan view of a second exemplary embodiment of a deformable plate usable in the dual substrate MEMS plate switch of FIG. 1.

FIG. 5 is a plan view of a second exemplary embodiment of the deformable plate 1300'. Deformable plate 1300' may differ from deformable plate 1300 by the placement and orientation of the four spring beams which support the deformable plate 1300'. A first set of spring beams 1332' are coupled to one side of the deformable plate 1300', and a second set of spring beams 1330' are coupled to the other side of deformable plate 1300'. However, in contrast to the spring beams 1330 of deformable plate 1300, spring beams 1330' extend in an opposite direction to spring beams 1332' of deformable plate 1300', after the bend in spring beams 1330' and 1332'. This may allow deformable plate 1300' to twist and translate somewhat in the plane of the deformable plate 1300', upon actuation by applying a differential voltage between deformable plate 1300' and an adjacent electrode, because of the flexibility of the bend between the beam segments. This twisting action may allow some lateral movement of shunt bars 1100 over contacts 2110 and 2120, thereby scrubbing the surface of the contacts to an extent. This scrubbing action may remove contamination and debris from the contact surfaces, thereby allowing improved contact and lower contact resistance.

The embodiment shown in FIG. 5 may be referred to as the anti-symmetric embodiment, because the spring beams 1330' extend from the beam in an opposite direction compared to spring beams 1332'. In other words, in the anti-symmetric embodiment 1300', the beam springs disposed on one side of the deformable plate are anti-symmetric with respect to the beams springs disposed on the opposite side of the deformable plate. Thus, when deformable plate 1300' is reflected across a longitudinal or latitudinal axis, the spring beams extend in an opposite direction from the bend. It should be understood that although a ninety-degree bend is illustrated in FIG. 5, the bend may have angles other than ninety-degrees, for example, for example, twenty or thirty degrees.

As shown in FIGS. 3 and 5, the deformable plate 1300 may have two shunt bars 1100 placed upon dielectric isolation layers 1100. Each shunt bar may close a respective set of contacts. For example, shunt bar 1110 in FIG. 3 may close one set of contacts 2210 and 2220, whereas shunt bar 1120 may close a second set of contacts 2110 and 2120. Therefore, each dual substrate MEMS plate switch may actually have two sets of switch contacts disposed in parallel with one another. The dual substrate MEMS plate switch may therefore still operate if one set of switch contacts fails. Furthermore, the overall switch resistance is only one-half of the switch resistance that would exist with a single set of switch contacts, because the two switches are arranged in parallel with one another.

Figure 6:
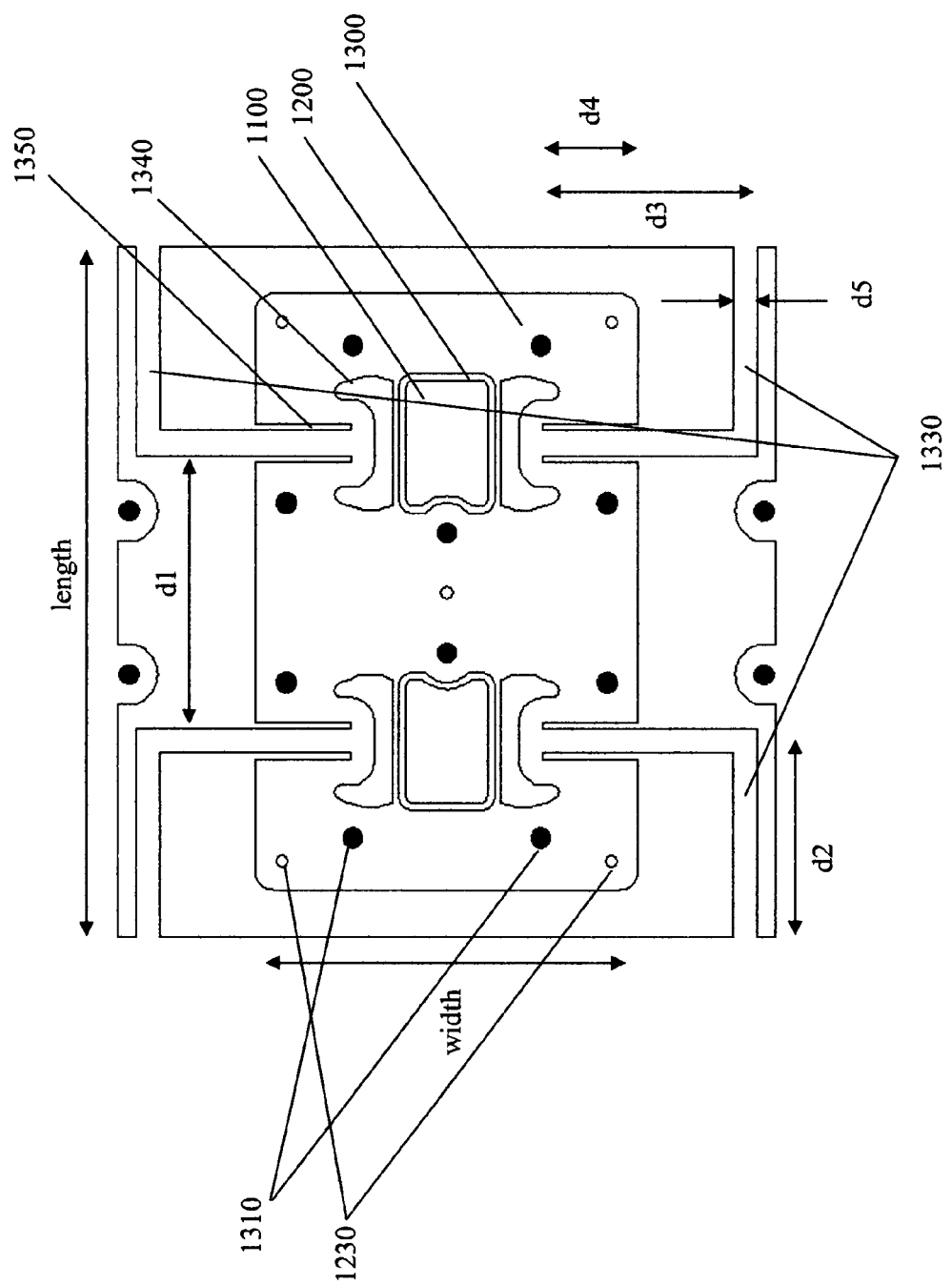
FIG. 6 is a plan view of a design for a third exemplary embodiment of a deformable plate usable in the dual substrate MEMS plate switch of FIG. 1.

FIG. 6 is a plan view of a layout of deformable plate 1300, showing additional detail of the embodiment. In particular, spring beams 1330 are formed with cutouts 1350 which penetrate the deformable plate 1300. The deformable plate may also have relieved areas 1340 formed near the locations of the shunt bars 1100. Both the cutouts 1350 and the relieved areas 1340 give the deformable plate additional flexibility in the area of the junction with the spring beams 1330. This may help decouple the motion of the plate 1300 from the deflection of the spring beams 1330. These features 1350 and 1340 may also help the deformable plate 1300 to close the switch effectively, in the event that the contacts 2210 and 2220 are recessed somewhat from the surface of the via substrate 2000, by giving the deformable plate 1300 additional flexibility in the region around the shunt bars 1200.

As shown in FIG. 6, deformable plate 1300 may have a length of about 300 μm and a width of about 200 μm. The separation d1 between the spring beams may be about 130 μm. The lengths of each segment d2 and d3 of the spring beams 1330 may be about 100 μm, so that the total length of the spring beams 1330 is about 200 μm. The lengths d4 of the cutouts 1350 may be about 50 μm, or about half the length of the beam segment d3. The width of the spring beam 1330 may be about 12 μm. The distance between the relieved areas 1340 may also be about 100 μm. The dimensions of the shunt bars 1100 may be about 40 μm width and about 60 μm length. The diameter of the via contacts 2110 and 2120 may be about 30 μm to about 50 μm. It should be understood that these dimensions are exemplary only, and that other dimensions and designs may be chosen depending on the requirements of the application.

Since the deformable plate 1300 may be made from the device layer 1010 of the SOI plate substrate 1000, it may be made highly resistive, of the order 20 ohm-cm. This resistivity may be sufficient to carry the actuation voltage of about 40 volts, but may too high to support the higher frequency alternating current voltages associated with the first vibrational mode at about 73 kHz. Accordingly, the resistivity may electrically dampen capacitive plate vibrations, especially the whole-body first mode plate vibration.

The electrostatic plate switch design illustrated in FIG. 6 may have a number of advantages over cantilevered switch designs, wherein the switch contacts are disposed at the end of a cantilevered beam. For example, as described above, multiple sets of switch contacts may be provided along a deformable plate, thereby reducing the overall switch resistance and therefore the loss across the switch. The multiple switch contacts also provide redundancy, such that the switch may still be useable even if one set of switch contacts fails. These design options are generally not available in a cantilevered switch design, because the contacts are necessarily placed at the distal end of the cantilevered beam.

In addition, the electrostatic deformable plate switch 100 may be made more compact than a cantilevered switch, because a long length of cantilevered beam is not required to have a sufficiently flexible member to actuate with modest voltages. For example, the plate design illustrated in FIG. 6 may be actuated with only 40 volts, because the spring beams 1330 which support the deformable plate may be made relatively flexible, without impacting the spacing between the electrical contacts 2110 and 2120.

Because the restoring force of the switch is determined by the spring beam 1330 geometry, rather than the plate 1300 geometry, modifications may be made to the plate 1300 design without affecting the kinematics of the spring beams 1330. For example, as mentioned above, a plurality of etch release holes 1310 may be formed in the deformable plate 1300, without affecting the stiffness of the restoring spring beams 1330. These release holes 1310 may allow air or gas to transit readily from one side of the deformable plate 1300 to the other side, thereby reducing the effects of squeeze film damping, which would otherwise reduce the speed of the device. These etch release holes 1310 may also reduce the mass of the deformable plate 1300, also improving its switching speed, without affecting the restoring force acting on the deformable plate 1300 through the spring beams 1330.

By placing the shunt bars near the nodal lines of a vibrational mode, the switching speed may be improved because the shunt contact interferes with vibratory motion in other modes. This effectively damps the vibrations in other modes. By placing the shunt bars at the nodal lines of a vibrational mode, the movement of the shunt bar is minimal, even if the plate is still vibrating in this mode. Therefore, although the deformable plate may be made exceptionally light and fast because of its small size and plurality of etch release holes, it vibrates only minimally because of its damping attributes. Accordingly, the electrostatic MEMS plate switch illustrated in FIG. 6 may be used in a vacuum environment, which is often not possible because in a vacuum, vibrations are no longer damped by viscous air motion around the moving member of the switch.

Because through wafer vias are used to route the signal to and from the dual substrate electrostatic MEMS plate switch 100, the switch 100 may be particularly suited to handling high frequency, RF signals. Without the through wafer vias, the signal would have to be routed along the surface of the second via substrate 2000, and under the hermetic bond line. However, because the hermetic bond line is metallic and grounded, this allows substantial capacitive coupling to occur between the surface routed signal lines and the ground plane of the device, which lies directly adjacent to, and narrowly separated from the signal lines in the bonding area. The through wafer vias allow this geometry to be avoided, thus reducing capacitive coupling and substantially improving the bandwidth of the device. The through wafer vias may also act as heat sinks, leading the heat generated in the switch to be directed quickly to the opposite side of the wafer and to the large bonding pads 2115 and 2125 on the backside of the device for dissipation.

FIGS. 7-15 depict steps in an exemplary method for manufacturing the dual substrate MEMS plate switch 100. The steps are divided into three sections: those steps depicted in FIGS. 7-9 pertaining to the preparation of features on the plate substrate 1000; those steps depicted in FIGS. 10-12 pertaining to the preparation of features on the via substrate 2000; those steps depicted in FIGS. 14-15 pertaining to the bonding to the plate substrate 1000 to the via substrate 2000, and formation of bond pads on the backside of the via substrate, to complete the device. FIG. 16 shows a cross section of the completed device shown in plan view in FIG. 15.

Figure 7:
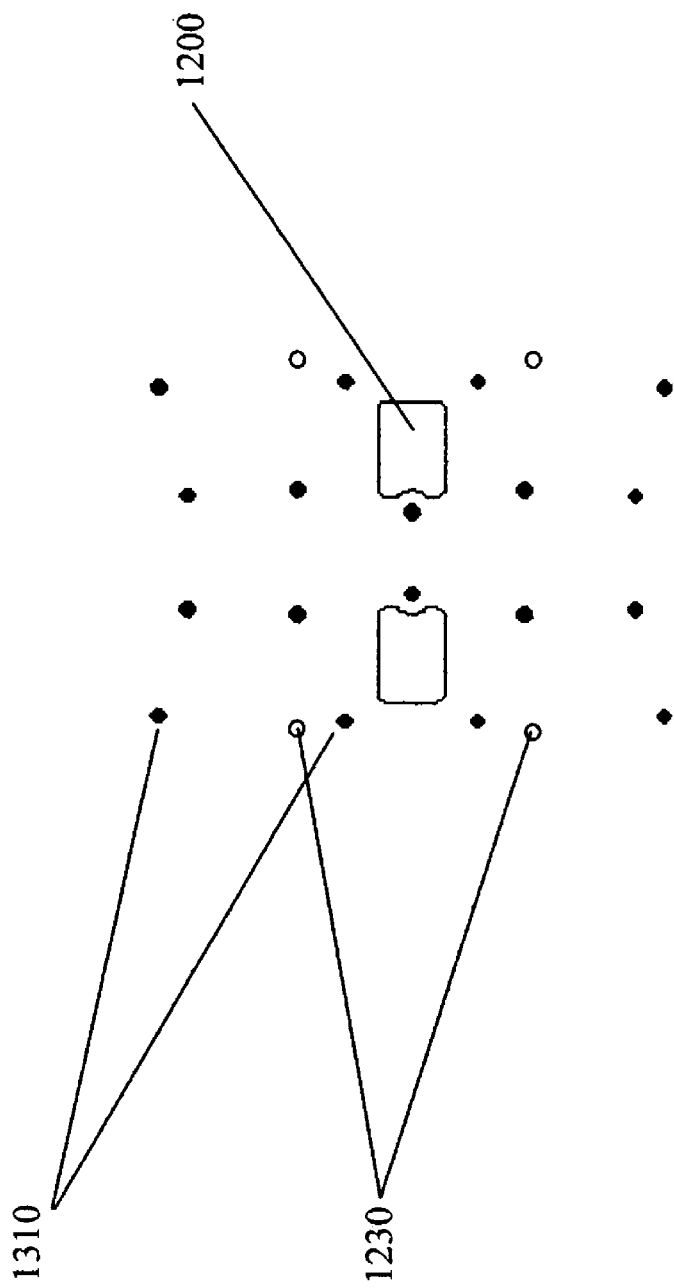
FIG. 7 is a diagram showing a first step in an exemplary method of manufacturing the first plate substrate of the dual substrate MEMS plate switch of FIG. 1, using the deformable plate of FIG. 6.

FIG. 7 depicts a first step in an exemplary method for manufacturing the features on the plate substrate 1000 shown in FIG. 1. The plate substrate 1000 may be a silicon-on-insulator substrate including a 5 μm thick device layer 1010, a 2 μm thick buried dielectric layer 1020, and a 500 μm thick handle layer 1030. In one exemplary embodiment, the buried dielectric layer may be a layer of silicon dioxide, and the steps described below are appropriate for this embodiment. The first step may include the formation of etch release holes 1310 in the device layer 1010 of the SOI plate substrate 1000. These holes 1310 may be formed by depositing and patterning photoresist in the appropriate areas, and dry etching the release holes through the device layer 1010, using the dielectric layer 1020 as an etch stop. These release holes 1310 may be, for example, about 2 µm to about 10 µm in diameter. If the release holes are distributed over the surface of the deformable plate to reduce the mass of the plate and improve mode coupling, they may be arranged in a hexagonal, close-packed array with diameters of 2 µm and spaced 3 µm apart. Deep reactive ion etching (DRIE) may be performed to etch the release holes using, for example, an etching tool manufactured by Surface Technology Systems of Newport, UK. Such a tool may be used for this and later DRIE steps, described below.

After etching the release holes 1310 in the device layer 1030, a thin multilayer of 15 nm chromium (Cr) and 100 nm nickel (Ni) may be sputtered onto the backside of the plate substrate 1000, for use as a plating base for the plating of a thicker layer of protective material, such as copper (Cu) or nickel (Ni). This protective layer of copper or nickel may protect the native oxide 1040 existing on the backside of the handle layer 1030 of the SOI substrate during the hydrofluoric acid etch to follow. The protective layer of copper or nickel may be about 4 µm thick, and may also minimize the wafer bow during further processing.

The dielectric layer 1020 may then be etched away beneath and around the etch release holes 1310, using a hydrofluoric acid liquid etchant, for example. The liquid etch may remove the silicon dioxide dielectric layer 1020 in all areas where the deformable plate 1300 is to be formed. The liquid etch may be timed, to avoid etching areas that are required to affix the spring beams 1330 of the deformable plate 1300, which will be formed later, to the handle layer 1030. Additional details as to the dry and liquid etching procedure used in this method may be found in U.S. patent application Ser. No. 11/359,558, incorporated by reference in its entirety.

The next step in the exemplary method is the formation of the dielectric pads 1200, 1210, and 1220, and dielectric standoffs 1230 as depicted in FIG. 3. Pad structures 1200, 1210 and 1220 form an electrical isolation barrier between the shunt bar 1100 and the deformable plate 1300, whereas standoffs 1230 form a dielectric barrier preventing the corners of the deformable plate 1300 from touching the adjacent actuation electrode 2300. The deformable plate 1300 and adjacent actuation electrode 2300 form the two plates of a parallel plate capacitor, such that a force exists between the plates when a differential voltage is applied to them, drawing the deformable plate 1300 towards the adjacent actuation electrode 2300.

The dielectric structures 1200, 1210, 1220 and 1230 may be silicon dioxide, which may be sputter-deposited over the surface of the device layer 1010 of the SOI plate substrate 1000. The silicon dioxide layer may be deposited to a depth of, for example, about 300 nm. The 300 nm layer of silicon dioxide may then be covered with photoresist which is then patterned. The silicon dioxide layer is then etched to form structures 1200, 1210, 1220 and 1230. The photoresist is then removed from the surface of the device layer 1010 of the SOI plate substrate 1000. Because the photoresist patterning techniques are well known in the art, they are not explicitly depicted or described in further detail.

Figure 8:
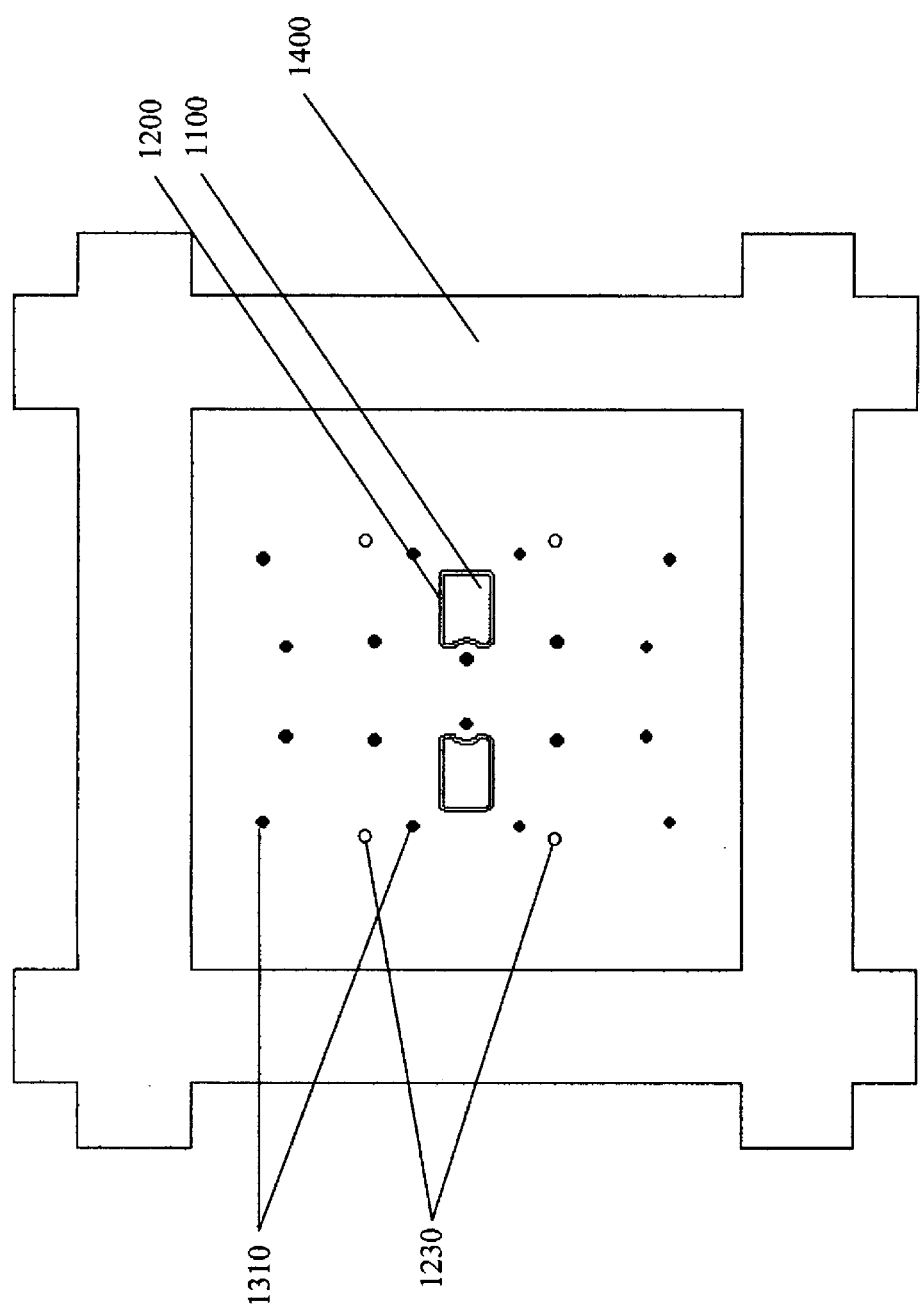
FIG. 8 is a diagram showing a second step in an exemplary method of manufacturing the first plate substrate of the dual substrate MEMS plate switch of FIG. 1, using the deformable plate of FIG. 6.

FIG. 8 depicts a second step in the preparation of the SOI plate wafer 1000. In the second step, a conductive material is deposited and patterned to form the shunt bar 1200 and a portion of what will form the hermetic seal. The hermetic seal may include a metal alloy formed from melting a first metal into a second metal, and forming an alloy of the two metals which blocks the transmission of gases. In preparation of forming the hermetic seal, a perimeter of the first metal material 1400 may be formed around the deformable plate 1300. The conductive material may actually be a multilayer comprising first a thin layer of chromium (Cr) for adhesion to the silicon and/or silicon dioxide surfaces. The Cr layer may be from about 5 nm to about 20 nm in thickness. The Cr layer may be followed by a thicker layer about 300 nm to about 700 nm of gold (Au), as the conductive metallization layer. Preferably, the Cr layer is about 15 nm thick, and the gold layer is about 600 nm thick. Another thin layer of molybdenum may also be used between the chromium and the gold to prevent diffusion of the chromium into the gold, which might otherwise raise the resistivity of the gold.

Each of the Cr and Au layers may be sputter-deposited using, for example, an ion beam deposition chamber (IBD). The conductive material may be deposited in the region corresponding to the shunt bar 1100, and also the regions which will correspond to the bond line 1400 between the plate substrate 1000 and the via substrate 2000 of the dual substrate electrostatic MEMS plate switch 100. This bond line area 1400 of metallization will form, along with a layer of indium, a seal which will hermetically seal the plate substrate 1000 with the via substrate 2000, as will be described further below.

While a Cr/Au multilayer is disclosed as being usable for the metallization layer of the shunt bar 1100, it should be understood that this multilayer is exemplary only, and that any other choice of conductive materials or multilayers having suitable electronic transport properties may be used in place of the Cr/Au multilayer disclosed here. For example, other materials, such as titanium (Ti) may be used as an adhesion layer between the Si and the Au. Other exotic materials, such as ruthenium (Ru) or palladium (Pd) can be deposited on top of the Au to improve the switch contact properties, etc. However, the choice described above may be advantageous in that it can also participate in the sealing of the device through the alloy bond, as will be described more fully below.

Figure 9:
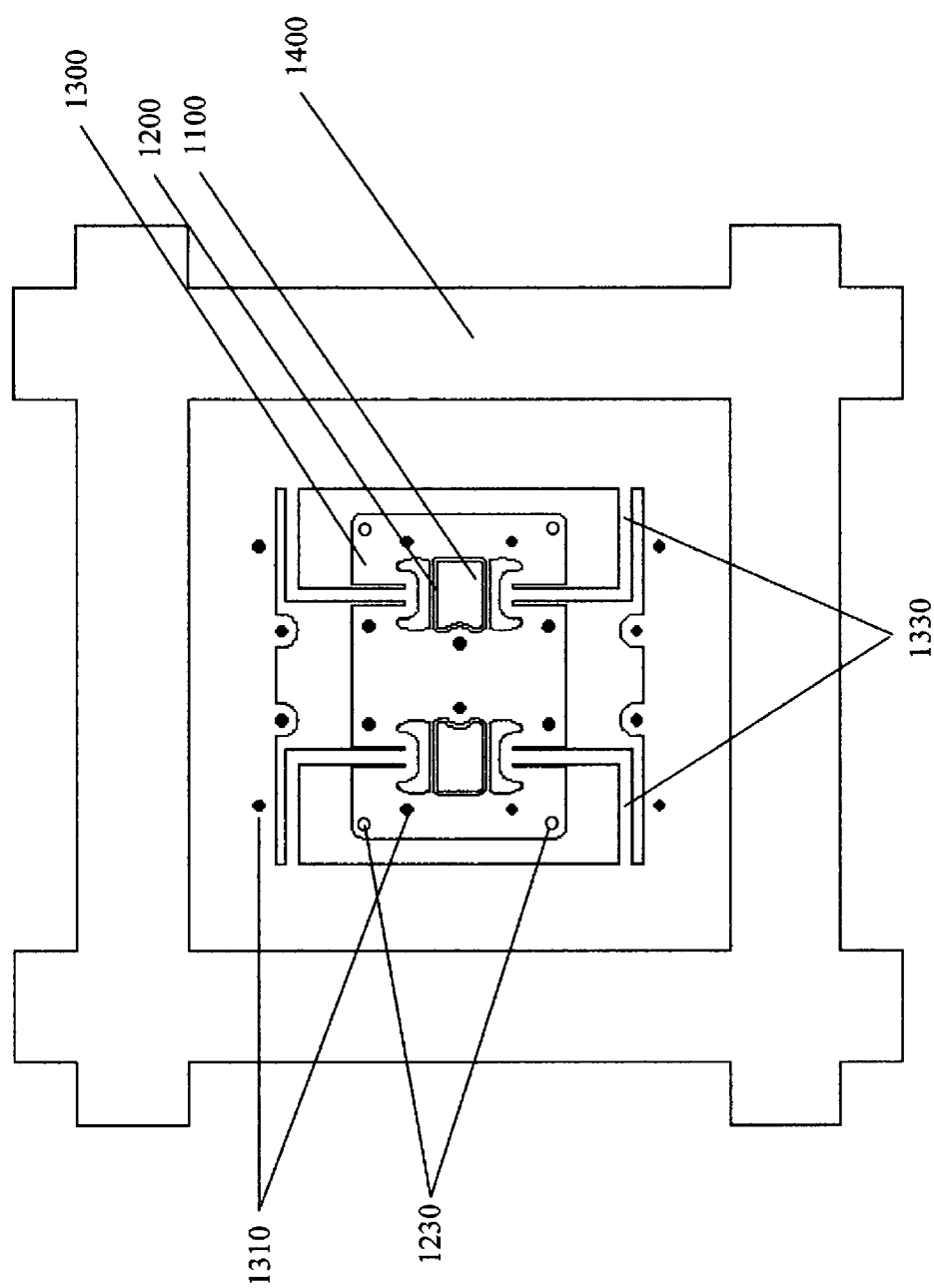
FIG. 9 is a diagram showing a third step in an exemplary method of manufacturing the first plate substrate of the dual substrate MEMS plate switch of FIG. 1, using the deformable plate of FIG. 6.

FIG. 9 shows the plate substrate 1000 of the dual substrate electrostatic MEMS plate switch 100 after the silicon device layer has been patterned to form the deformable plate 1300. To form the deformable plate, the surface of the device layer 1010 of the SOI plate substrate 1000 is covered with photoresist which is patterned with the design of the deformable plate. The deformable plate outline is the etched into the surface of the device layer by, for example, deep reactive ion etching (DRIE). Since the underlying dielectric layer 1020 has already been etched away, there are no stiction issues arising from the liquid etchant, and the deformable plate is free to move upon its formation by DRIE. As before, since the photoresist deposition and patterning techniques are well known, they are not further described here.

Figure 11:
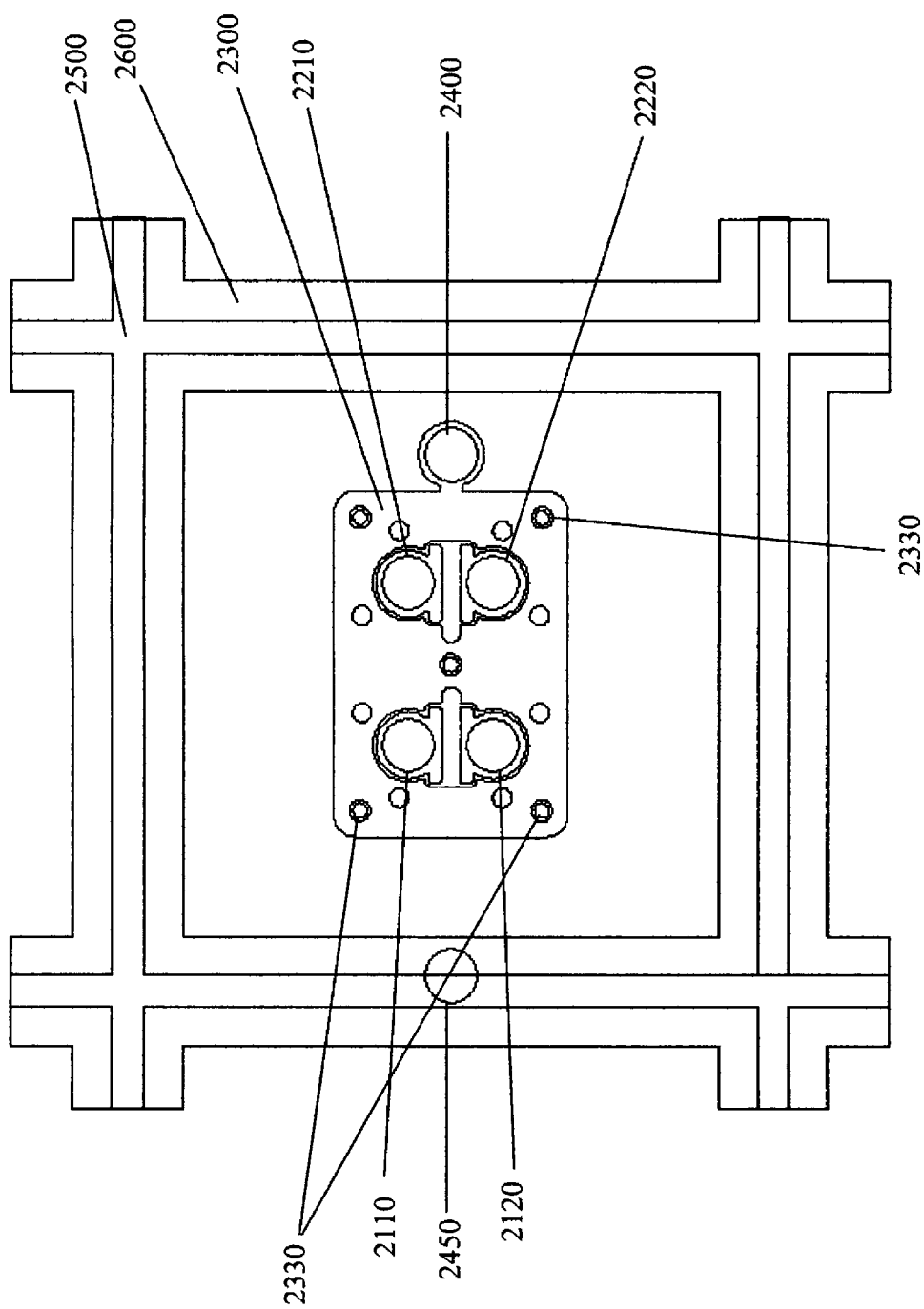
FIG. 11 is a diagram showing a second step in an exemplary method of manufacturing the second via substrate of the dual substrate MEMS plate switch of FIG. 1.
Figure 12:
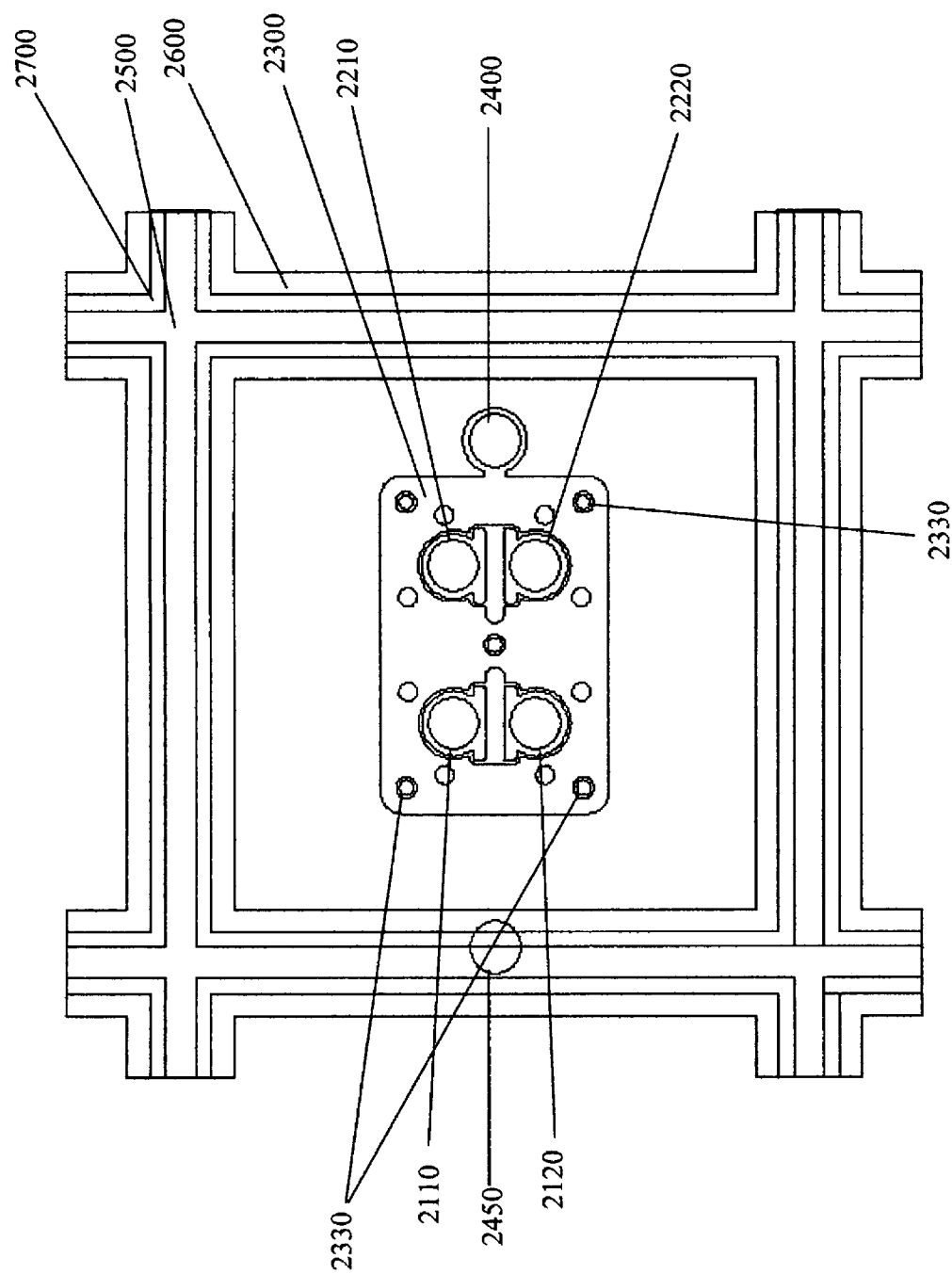
FIG. 12 is a diagram showing a third step in an exemplary method of manufacturing the second via substrate of the dual substrate MEMS plate switch of FIG. 1.

Preparation of the plate substrate 1000 is thereby completed. The description now turns to the fabrication of the via substrate 2000, as illustrated in FIGS. 10-12.

Figure 10:
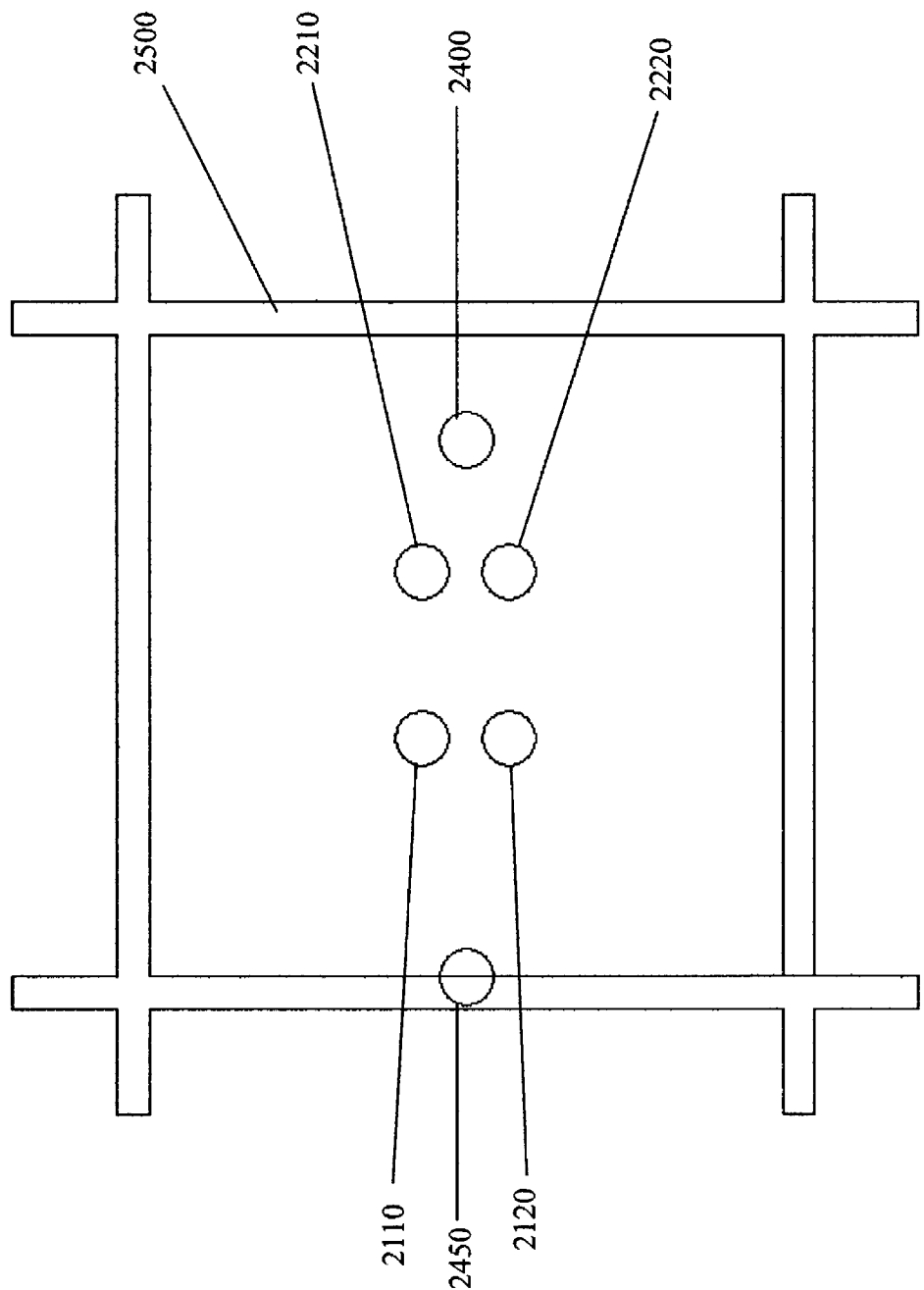
FIG. 10 is a diagram showing a first step in an exemplary method of manufacturing the second via substrate of the dual substrate MEMS plate switch of FIG. 1.

FIG. 10 shows a first step in fabricating the via substrate 2000 of the dual substrate electrostatic MEMS plate switch 100. The via substrate 2000 may be, for example, silicon, glass, or any other suitable material consistent with the process described below, or suitable equivalent steps. In one exemplary embodiment, the via substrate is a 500 µm thick silicon wafer. The via substrate 2000 may be covered with a photoresist, which is patterned in areas corresponding to the locations of vias 2110, 2120, 2210, 2220, 2400 and 2450, or electrical conduits that will be formed in the via substrate 2000.

Blind trenches may first be etched in the substrate 2000, for the formation of a set of vias 2110, 2120, 2210, 2220, 2400 and 2450 which will be formed in the trenches by plating copper into the trenches. A "blind trench" is a hole or depression that does not penetrate through the thickness of the via substrate 2000, but instead ends in a dead end wall within the material. The etching process may be reactive ion etching (RIE) or deep reactive ion etching (DRIE), for example, which may form blind trenches, each with a dead-end wall. The etching process may be timed to ensure that the vias 2110, 2120, 2210, 2220, 2400 and 2450 extend substantially into the thickness of the via substrate. For example, the vias 2110, 2120, 2210, 2220, 2400 and 2450 may be etched to a depth of about 80 µm to about 150 µm deep into the via substrate 2000. When the vias are completed as described below, via 2450 may provide electrical access to the deformable plate 1300, and provide a voltage for one side of the parallel plate capacitor which may provide the electrostatic force required to close the switch; via 2400 may provide electrical access to the electrostatic plate 2300 which forms the other side of the parallel plate capacitor; via 2110 may provide electrical access to one of the contact electrodes 2112 of the switch; via 2120 may provide electrical access to the other contact electrode 2122 of the switch, and so forth. After etching the blind trenches 2100-2450, the via substrate may be cleaned with a solvent to remove any polymers that may remain on the walls of the blind trenches after the dry etch procedure.

After formation of the blind trenches 2100-2450 and cleaning thereof, the substrate 2000 may be allowed to oxidize thermally, to form a layer of silicon dioxide 2050, which electrically isolates one via from the next, as shown in FIG. 1. The oxide may be about 2 µm thick, for example. A seed layer (not shown) may then be deposited on the upper surface and in the blind trenches. The seed layer may be, for example, a thin layer of chromium followed by a thin layer of gold, the chromium for adhesion and the gold as a seed layer for the plating of copper into the vias 2110-2450. The chromium/gold seed layer may be, for example, about 850 nm in thickness, with about 100 nm of chromium and about 750 nm of gold, and may be deposited by, for example, ion beam deposition (IBD) to provide an electrically continuous film of plating base to the bottom and sides of the vias. Metals, such as Cu, may also be deposited using chemical vapor deposition (CVD) methods, so long as the metal is a compatible seed layer for the conductive material to be subsequently plated into the blind trench.

In order to fill the blind trenches 2100-2450 completely with the conductive material, the seed layer may be plated using reverse-pulse-plating, as described in more detail in co-pending U.S. patent application Ser. No. 11/482,944, incorporated by reference herein in its entirety.

The blind trenches 2110-2450 may then be plated with copper, for example, or any other suitable conductive material that can be plated into the blind trenches, such as gold (Au) or nickel (Ni), to create vias 2110-2450. To assure a complete fill, the plating process may be performed until the plated material fills the blind trenches to a point up and over the surface of the substrate 2000. The surface of the substrate 2000 may then be planarized, using, for example, chemical mechanical planarization, until the plated vias 2110-2450 are flush with the surface of the substrate 2000, as shown in FIG. 10. The planarization process may stop on the seed layer or the dielectric layer 2050 of the substrate, leaving for example, about 1 µm of the previously grown dielectric layer 2050, which continues to provide electrical isolation between the interior metal structures of the devices, which would otherwise be electrically connected by the silicon via substrate 2000.

A standoff 2500 may then be formed on the substrate 2000, as shown in FIG. 10. This standoff may determine the separation between the plate substrate 1000 bearing the deformable plate 1300 and the via substrate 2000, when the two substrates are bonded together. Any mechanically rigid material may be used, which is capable of forming a sufficiently stiff standoff. In one convenient embodiment, a polymer such as photoresist is patterned and cured for use as standoffs 2510 and 2520. The polymer may be, for example, about 1 µm in thickness. The photoresist may be deposited and patterned, after which the remaining photoresist portions 2500 may be baked to completely cure these structures. The negative tone photoresist SU-8, developed by IBM of Armonk, N.Y., may be a suitable material for forming the standoff 2500.

Another metallization layer is then deposited over the substrate 2000, as shown in FIG. 11, which will form the bond ring 2600 as well as contact electrodes 2112, 2122, 2212 and 2222. Metallization region 2300 is also deposited in this step, which will form the adjacent electrode in the parallel plate capacitor of the switch. In one exemplary embodiment, the metallization layer may actually be a multilayer of Cr/Au, the same multilayer as was used for the metallization layer 1400 on the plate substrate 1000 of the dual substrate electrostatic MEMS plate switch 100. The metallization multilayer may have similar thicknesses and may be deposited using a similar process as that used to deposit metallization layer 1400 on substrate 1000. The metallization layer may also serve as a seed layer for the deposition of indium, as described below.

Although metallization layer is described as consisting of a thin adhesion layer of Cr, and an optional antidiffusion layer of Mo, followed by a relatively thick layer of Au, it should be understood that this embodiment is exemplary only, and that any material having acceptable electrical transport characteristics may be used as metallization layer 2600. In particular, additional exotic materials may be deposited over the gold, to achieve particular contact properties, such as low contact resistance and improved wear.

Figure 13:
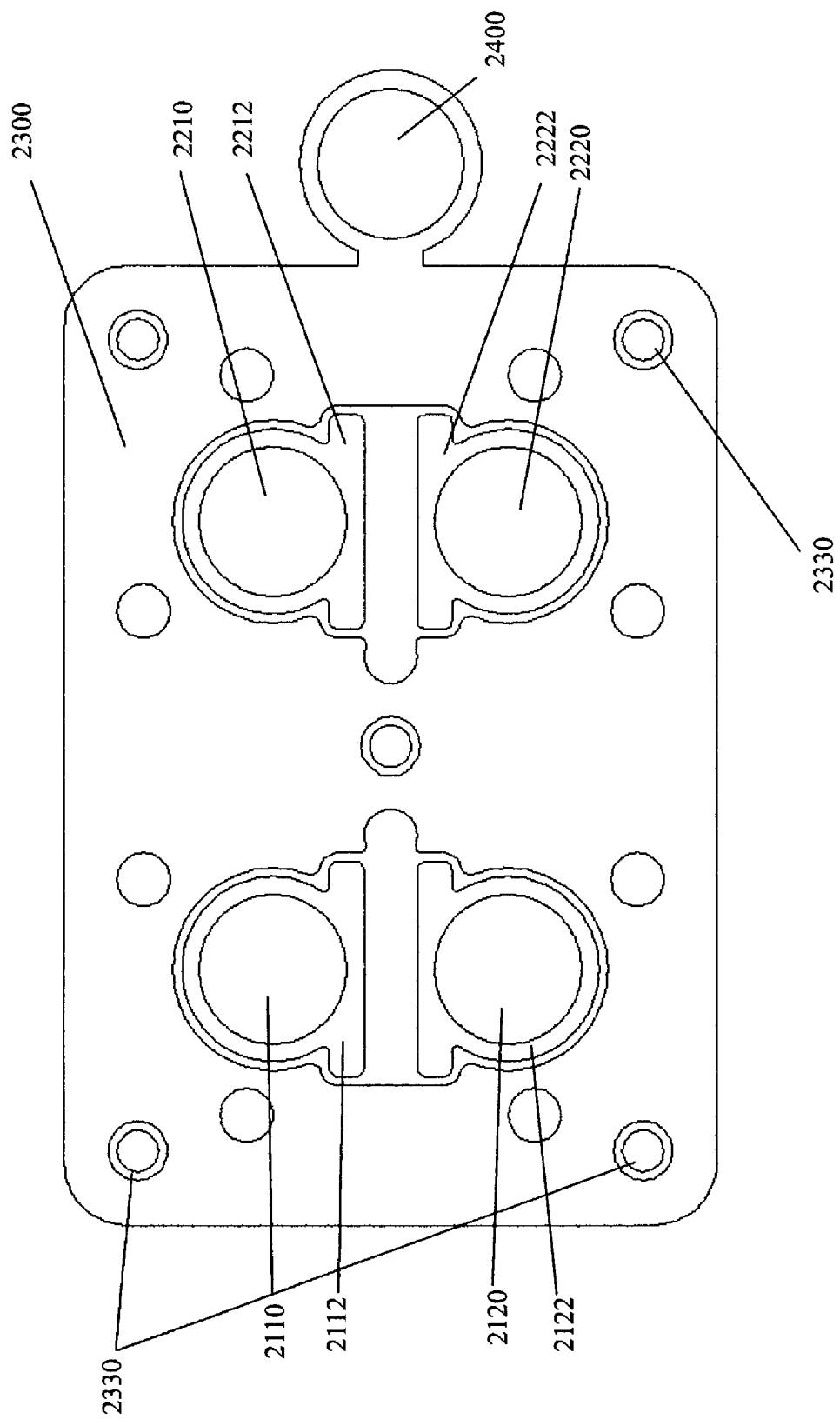
FIG. 13 is a diagram showing a greater detail of the lower electrode formed on the second via substrate of the dual substrate MEMS plate switch of FIG. 1.
Figure 14:
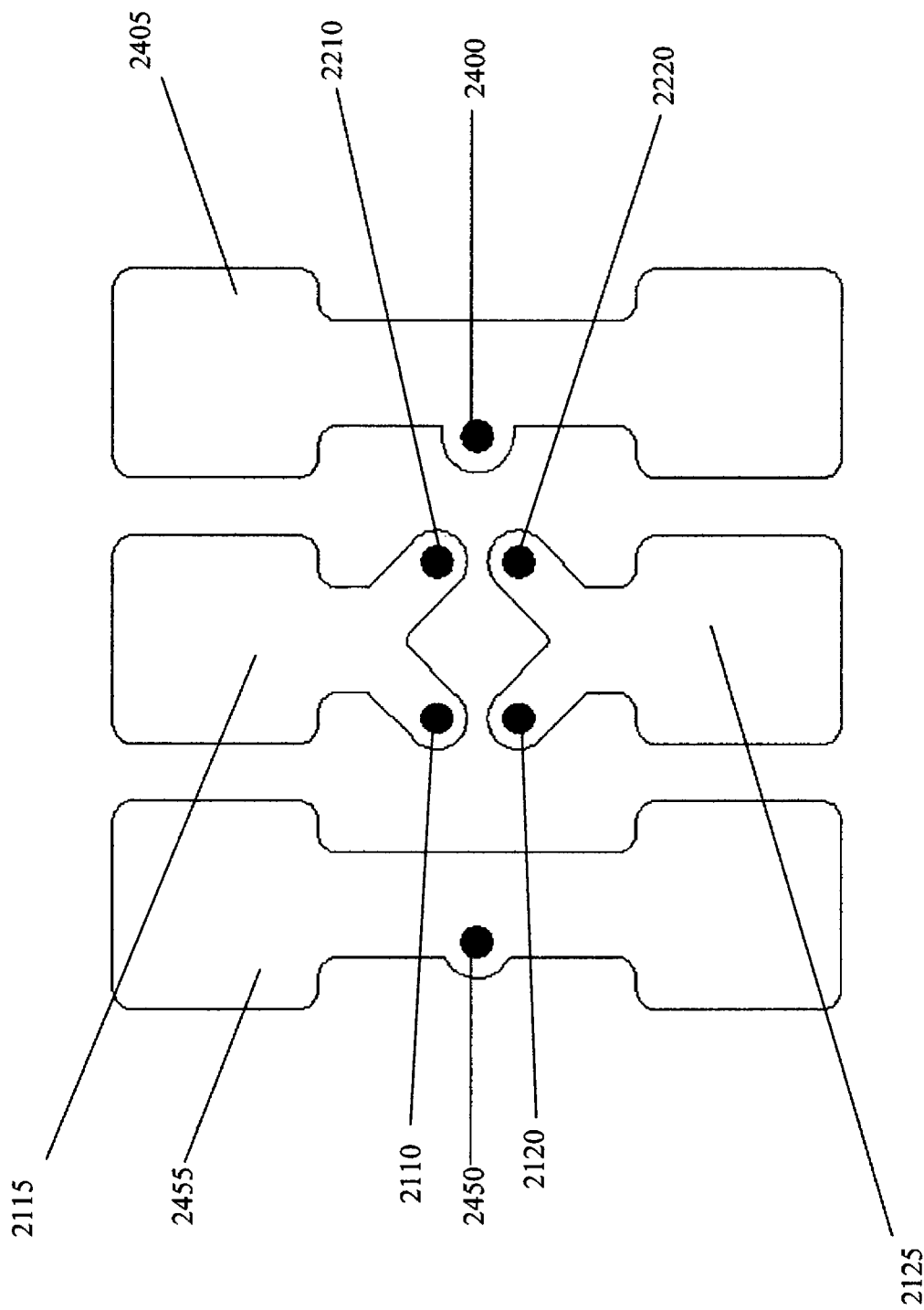
FIG. 14 is a diagram showing the bonding pad design formed on the backside of the dual substrate MEMS plate switch of FIG. 1.

Photoresist may then be deposited on metallization layer, and patterned to provide features needed to form contacts 2112, 2122, 2212, 2222, 2300 and 2600. The photoresist is exposed and developed to correspond to regions 2100-2300 and 2600. The substrate with the Cr/Au conductive material may then be wet etched to produce the conductive features 2100-2300 and 2600. A suitable wet etchant may be iodine/iodide for the Au and permanganate for the Cr. FIG. 13 shows greater detail of contacts 2112, 2122, 2212, 2222, 2300 and 2400. Also shown in FIG. 13 are features 2330, which serve as regions in which the gold electrode can be electrically isolated from the gold which comes into contact with the dielectric standoffs 1230 when the switch is closed.

Photoresist may then again be deposited over metallization layer 2600, and patterned to provide features for the plating of an indium layer 2700, as shown in FIG. 12. The indium layer 2700 will, along with the Au layer, form a hermetic seal that will bond the plate substrate 1000 to the via substrate 2000 of dual substrate electrostatic MEMS plate switch 100. The substrate 2000 with the patterned photoresist layer may then be immersed in an indium plating bath, such that indium layers 2700 are plated in the feature, as shown in FIG. 12. The thickness of the plated indium layer may be, for example, about 3 µm to about 6 µm, and more preferably about 4 µm. It may be important to control the relative thickness (and therefore volume) of the indium compared to the thickness of the Au in metallization layer 2600, such that the ratio of materials may be appropriate to form an alloy of stoichiometry $AuIn_x$, where x is about 2. Since the molar volume of indium is about 50% greater than gold, a combined gold thickness of both wafers of about 800 nm to about 1600 nm may be approximately correct to form the $AuIn_2$ alloy. It may also be important to provide sufficient gold thickness that a thin layer of gold remains on the surface of the substrate 2100 to provide good adhesion to the substrate, after the formation of the gold/indium alloy. This can additionally be ensured by plating the indium layer narrower than the gold metallization layers, as shown in FIG. 12, such that the final volumes and ratio of gold/indium provides for a slight excess of gold at the substrate interface.

It may be important for gold metallization 2600 be wider in extent than the plated indium layer 2700. The excess area may allow the indium to flow outward somewhat upon melting, without escaping the bond region, while simultaneously providing for the necessary Au/In ratios cited above.

The two portions, the plate substrate 1000 and the via substrate 2000 are now ready to be assembled to form the dual substrate electrostatic MEMS plate switch 1100. The two portions may be first aligned, such that the metallization layers 1400 of plate substrate 1600 are registered with the metallization layers 2700 of the via substrate 2000. This places the plated indium layer 2700 between gold metallization layers 1400 and 2600.

Methods and techniques for forming the alloy seal are further described in U.S. patent application Ser. No. 11/211,625 and U.S. patent application Ser. No. 11/211,622, each of which is incorporated by reference herein in its entirety.

For MEMS switches that benefit from a defined ambient environment, the two portions 1000 and 2000 of the electrostatic MEMS plate switch 100 may first be placed in a chamber which is evacuated and then filled with the desired gas. For example, for MEMS switches to be used in telephone applications using relatively high voltage signals, the desired gas may be an insulating gas such as sulfur hexafluoride ($SF_6$), $CO_2$ or a freon such as $CCl_2F_2$ or $C_2Cl_2F_4$. The insulating gas may then be sealed within the dual substrate electrostatic MEMS plate switch 100 by sealing the plate substrate 1000 with the via substrate 2000 with the alloy bond formed by layers 1400, 2600 and 2700. Alternatively, an evacuated or sub-ambient or super-ambient environment may be sealed in the MEMS plate switch 100 with a substantially hermetic seal. The term "substantially hermetic" may be understood to mean that the environment sealed with the device at manufacture retains at least about 90% of its original composition over the lifetime of the device. For a device sealed with a sub-ambient or super-ambient environment, the pressure at its end-of-life may be within about 10% of its pressure at manufacture.

To form the alloy bond between layers 1400, 2600 and 2700, plate substrate 1000 may be applied to the via substrate 2000 under pressure and at elevated temperature. For example, the pressure applied between the cantilevered portion 1000 and the electrical contacts portion 2000 may be from 0.5 to 2.0 atmospheres, and at an elevated temperature of about 180 degrees centigrade. This temperature exceeds the melting point of the indium (157 degrees centigrade), such that the indium flows into and forms an alloy with the gold. As mentioned above, the stoichiometry of the alloy may be about 2 indium atoms per one gold atom, to form $AuIn_x$ where x is about 2. In contrast to the low melting point of the indium metal, the melting point of the alloy is 541 degrees centigrade. Therefore, although the alloy is formed at a relatively low temperature, the durability of the alloy bond is outstanding even at several hundred degrees centigrade. The bond is therefore compatible with processes which deposit vulnerable materials, such as metals, on the surfaces and in the devices. These vulnerable materials may not be able to survive temperatures in excess of about 200 degrees centigrade, without volatilizing or evaporating.

Upon exceeding the melting point of the indium, the indium layers 2700 flows outward, and the plate substrate 1000 and the via substrate 2000 are pushed together, until their approach is stopped by the polymer standoff 2500. As the alloy forms, it may immediately solidify, sealing the preferred environment in the dual substrate electrostatic MEMS plate switch 100.

While the systems and methods described here use a gold/indium alloy to seal the MEMS plate switch, it should be understood that the dual substrate electrostatic MEMS plate switch 100 may use any of a number of alternative sealing methodologies, including different constituent metals for the bond-line and cross-linked polymers. For example, the seal may also be formed using a low-outgassing epoxy which is impermeable to the insulating gas.

In order to apply the appropriate signals to contact pads 2112, 2122, 2212, 2222, 2400 and 2450, electrical access may need to be achieved to vias 2112, 2122, 2212, 2222, 2400 and 2450. As described earlier, vias 2110, 2120, 2210, 2220, 2400 and 2450 begin as blind trenches formed in one side of the substrate, and plated with a conducting material. To provide access the conducting vias formed in the front side, material from the opposite, back side of substrate 2000 may be removed until the dead-end walls of the blind trenches 2110-2450 have been removed, such that electrical access to the vias may be made from the back side. In one exemplary embodiment, the original 500 μm thick silicon wafer is background until it has a thickness of about 80 μm, and the vias 2110, 2120, 2210, 2220, 2400 and 2450 extend through the entire thickness of the remaining silicon. The technique for removing the excess material may be, for example, grinding. The processes used to form the vias is described in more detail in U.S. patent application Ser. No. 11/211,624 and U.S. patent application Ser. No. 11/482,944, incorporated by reference herein in their entireties.

The via substrate 2000 may then be coated with an oxide 2200, which may be $SiO_2$, for example, at a thickness sufficient to isolate the vias 2110-2220 one from the other. The oxide may be deposited by a low temperature dielectric deposition process, such as sputtering or plasma enhanced chemical vapor deposition (PECVD) to a thickness of about 1 μm. The oxide-coated substrate 2000 may then be covered with photoresist and patterned to form openings at the locations of the vias 2110-2145. The substrate 2000 may then be etched through the photoresist to remove the oxide 2200 from the backside openings of the vias 2110-2450. The photoresist may then be stripped from the substrate 2000. Since these processes are well known in the art, they are not described or depicted further.

The rear surface of substrate 2100 may then be covered with a conductive layer. In some exemplary embodiments, the conductive layer may be a Cr/Au multilayer, chosen for the same reasons as multilayers 1900 and 2600, and deposited using the same or similar techniques. Alternatively, the conductive layer may be any conductive material having acceptable electrical and/or thermal transport characteristics. In one exemplary embodiment, the conductive material may be a multilayer of 15 nm chromium, followed by 800 nm of nickel, and finally 150 nm of gold. The nickel may give the multilayer better wear and durability characteristics that the gold alone over the chromium layer, which may be important as these features are formed on the exterior of the electrostatic MEMS plate switch 100.

The conductive layer is then covered once more with photoresist, which is also patterned with features which correspond to pads 2115, 2125, 2405 and 2455 on the backside of the device 100. Alternatively, the metal may be deposited through a shadow mask, allowing for the possibility of thicker layers and eliminating the need for further processing.

The conductive layer on the rear of the substrate 2000 is then etched or ion milled, for example, to remove the conductive layer at the openings of the photoresist, to form isolated conductive bonding pads 2115, 2125, 2405 and 2455. Conductive bonding pad 2115 may provide electrical access to the contact points 2110 and 2120 of the switch; conductive bonding pad 2125 may provide electrical access to the contact points 2210 and 2220 of the switch; conductive bonding pad 2405 may provide electrical access to via 2400 and adjacent electrode 2300 of the switch; and conductive bonding pad 2455 may provide the ground signal to the dual substrate MEMS electrostatic plate switch. These bonding pads 2115, 2125, 2405 and 2455 are shown in the plan view of the back side of the via substrate in FIG. 14. After formation of bonding pads 2115, 2125, 2405 and 2455, the electrostatic MEMS plate switch is essentially complete, and the wafer pair 1000 and 2000 may be sawed and/or diced to separate the individual electrostatic MEMS plates switches from the adjacent devices formed on the wafers.

Figure 15:
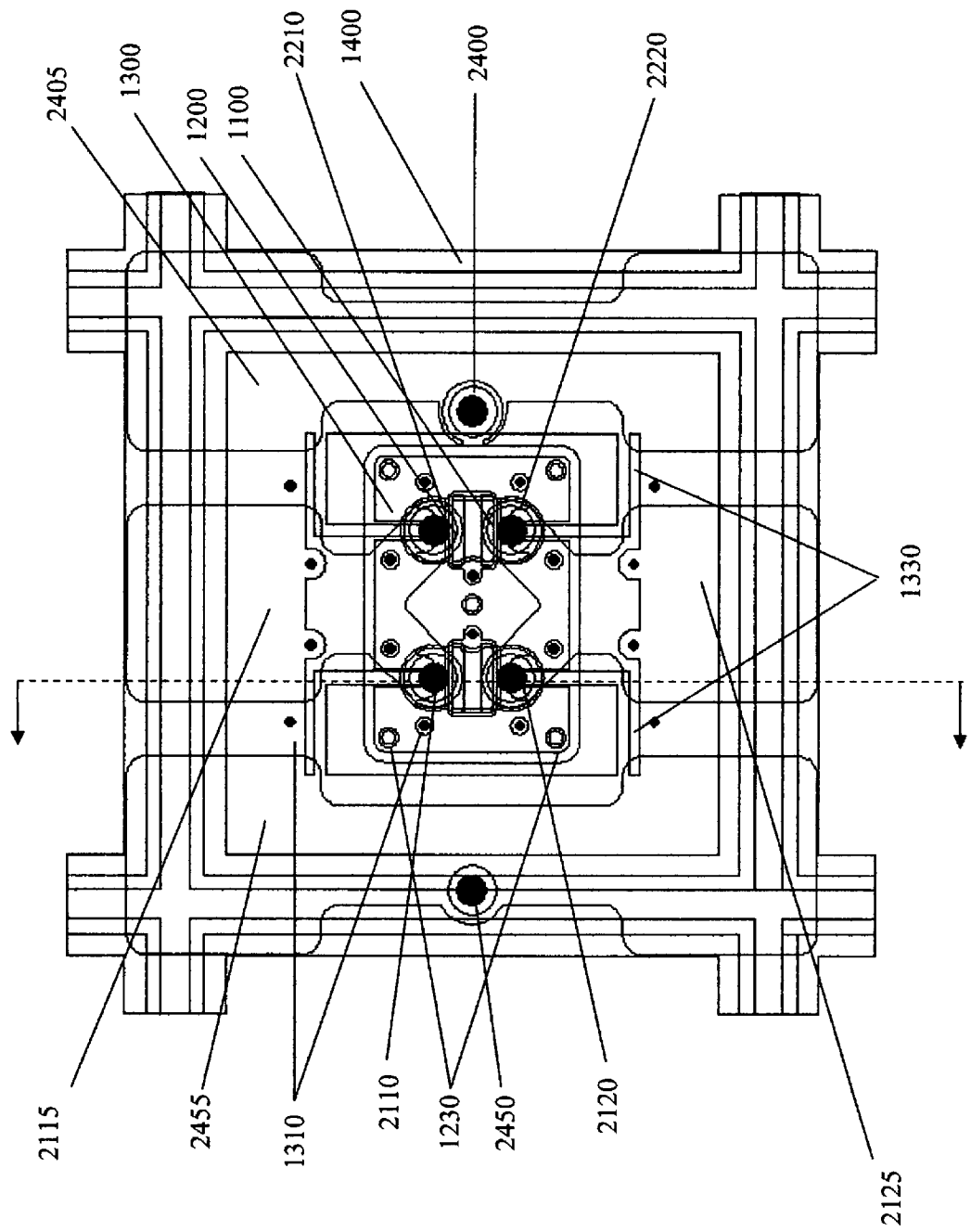
FIG. 15 is a diagram of the completed dual substrate MEMS plate switch of FIG. 1, with an indication of the cross section shown in FIG. 16.
Figure 16:
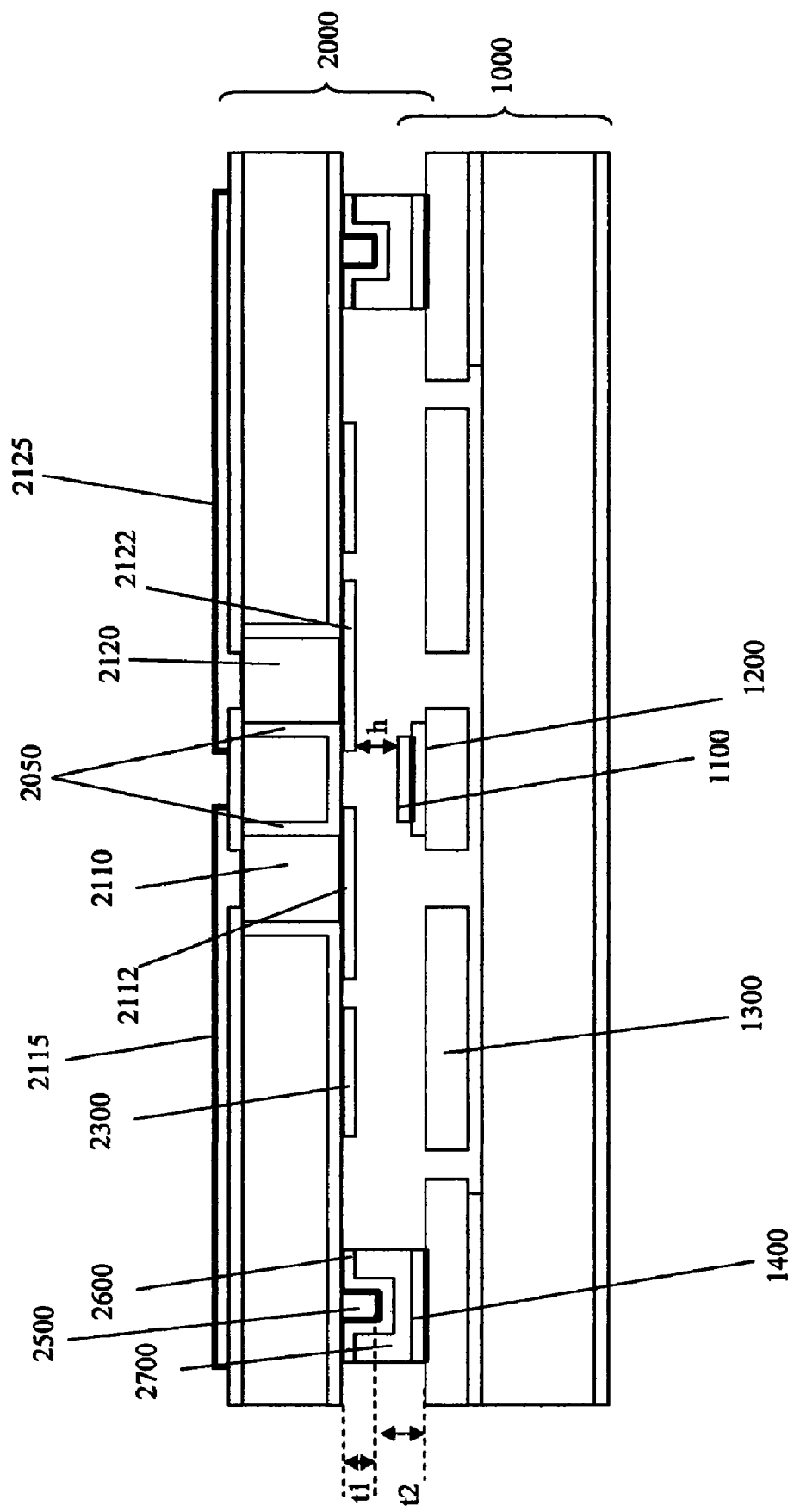
FIG. 16 is a cross sectional view of the dual substrate MEMS plate switch along the cross section indicated in FIG. 15.

FIG. 15 shows an individual dual substrate electrostatic MEMS plate switch 100 after manufacture and assembly. In its completed state, the shunt bar 1100 on the deformable plate 1300 hangs adjacent to and spanning the electrical contacts 2110 and 2120, and the deformable plate 1300 is also adjacent to the metallization plate 2300, as shown in FIG. 1. Upon applying appropriate voltages to vias 2400 and 2450 using conductive bonding pads 2405 and 2455, respectively, a differential voltage forms across the parallel plate capacitor formed by the deformable plate 1300 and the electrode 2300, drawing the deformable plate 1300 toward the electrode 2300. At it lower point of travel or vibration of the deformable plate 1300, the shunt bar 1110 affixed to the deformable plate 1300 is applied across the electrical contacts 2110 and 2120 of the switch 100, and shunt bar 1120 is applied across electrical contacts 2210 and 2220, thereby closing the switch. An input electrical signal applied to one of the electrical contacts 2110 and 2210 by conductive bonding pad 2115 may then be obtained as an output electrical signal from either of the other contacts 2120 or 2220 by the other conductive bonding pad 2125. The switch may be opened by discontinuing the voltages applied to the plate 1300 and electrode 2300, whereupon the switch may return to its original position because of the restoring spring force acting on the stiff spring beams 1330 coupled to the deformable plate 1300.

Exemplary thicknesses of various layers of the dual substrate electrostatic MEMS plate switch 100 are shown in FIG. 16. It should be understood that the features depicted in FIG. 16 may not necessarily be drawn to scale. As shown in FIG. 16, an exemplary thickness of the Cr/Au conductive layer 2600 is about 0.75 μm. An exemplary distance h between the upper surface of the shunt bar 1100 and the lower surface of the contact point 2112, also defined as the throw of the switch, may be, for example, about 1.0 μm. An exemplary thickness of the conductive material of the shunt bar 1100 and contacts 2122 and 2112 may be, for example, about 0.75 μm each. An exemplary thickness of the deformable plate 1300 may be about 5.0 μm, which may also be the thickness of the device layer 1010. An exemplary thickness of the isolation layer 1200 may be about 0.3 μm. Finally, an exemplary thickness t1 of the polymer standoff 2520 may be about 1.0 μm, which also defines a minimum separation between the plate substrate 1000 and the via substrate 2000, of the dual substrate electrostatic MEMS plate switch 100. An exemplary thickness t2 of the alloy bond (In material as well as Cr/Au multilayers) may be about 1.7 μm. It should be understood that the dimensions set forth here are exemplary only, and that other dimensions may be chosen depending on the requirements of the application.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, while the disclosure describes a number of fabrication steps and exemplary thicknesses for the layers included in the MEMS switch, it should be understood that these details are exemplary only, and that the systems and methods disclosed here may be applied to any number of alternative MEMS or non-MEMS devices. Furthermore, although the embodiment described herein pertains primarily to an electrical switch, it should be understood that various other devices may be used with the systems and methods described herein, including actuators and valves, for example. Accordingly, the exemplary implementations set forth above, are intended to be illustrative, not limiting.

What is claimed is:

1. A method for manufacturing an electrostatic MEMS device, comprising:

providing a silicon-on-insulator substrate including a silicon device layer, and insulating layer and a silicon handle layer;

forming a first plate in the device layer of the silicon-on-insulator substrate and suspended adjacent to the handle layer of the silicon-on-insulator substrate, wherein the first plate is coupled to the silicon-on-insulator substrate by a plurality of spring beams;

forming at least one electrical contact on a second substrate, wherein the first plate is configured to move toward the at least one electrical contact; and coupling the device layer of the silicon-on-insulator substrate to the second substrate with a seal that seals the MEMS device.

2. The method of claim 1, further comprising:

forming at least one shunt bar on the first plate, disposed substantially on a nodal line of a vibrational mode of the first plate; and forming an electrostatic second plate on the second substrate, adjacent to the first plate.

3. The method of claim 2, wherein forming the electrostatic second plate and the at least one electrical contact further comprises:

depositing a seed layer over the second substrate;

depositing a conductive material over the seed layer; and patterning the electrostatic second plate and the at least one electrical contact from the conductive material.

4. The method of claim 1, further comprising:

forming at least one electrical via through a thickness of the second substrate;

electrically coupling the at least one electrical via to the at least one electrical contact, and electrically coupling the at least one via to the plate.

5. The method of claim 4, wherein forming the at least one electrical via comprises:

forming at least one blind hole with a dead end wall on a front side of the second substrate;

forming a seed layer in the at least one blind hole;

depositing a conductive material onto the seed layer; and removing material from a rear side of the second substrate to remove the dead-end wall of the at least one blind hole.

6. The method of claim 5, wherein depositing a conductive material onto the seed layer comprises plating copper onto the seed layer.

7. The method of claim 1, wherein coupling the first substrate to the second substrate with a seal comprises:
depositing a first metal between the first substrate and the second substrate; and
depositing a second metal between the first substrate and the second substrate; and
coupling the first substrate to the second substrate by heating the first metal and the second metal to at least a melting point of at least one of the first metal and the second metal, to form a substantially hermetic alloy seal around the MEMS device.

8. The method of claim 1, wherein the first substrate comprises a silicon-on-insulator substrate, and the second substrate comprises at least one of a silicon wafer and a silicon-on-insulator substrate.

9. The method of claim 8, wherein forming the first plate suspended over the first substrate comprises:
etching a plurality of holes into a device layer of the silicon-on-insulator substrate;
etching a dielectric layer beneath the device layer of the silicon-on-insulator substrate through the plurality of holes; and
etching an outline of the first plate in the device layer of the silicon-on-insulator substrate.

10. An electrostatic MEMS device, comprising:
a silicon-on-insulator substrate including a silicon device layer, an insulating layer and a silicon handle layer;
a first plate formed in the device layer of the silicon-on-insulator substrate, and suspended adjacent to the handle layer of the silicon-on-insulator substrate, the first suspended plate being coupled to the silicon-on-insulator substrate by a plurality of spring beams;
at least one electrical contact formed on a second substrate, wherein the first plate is configured to move toward the at least one electrical contact; and
a seal which couples the device layer of the silicon-on-insulator substrate to the second substrate, and seals the MEMS device.

11. The electrostatic MEMS device of claim 10, wherein the plurality of spring beams comprises at least two spring beams, at least one of the two spring beams disposed on one side of the first plate, and at least one other of the at least two spring beams disposed on an opposite side of the first plate, wherein each spring beam has a segment extending from the first plate which is coupled to an adjoining segment by a bend.

12. The electrostatic MEMS device of claim 11, wherein the first plate and spring beams are symmetric about at least one of a longitudinal and latitudinal axis of the first plate.

13. The electrostatic MEMS device of claim 11, wherein the at least one spring beam disposed on one side of the first plate is anti-symmetric with respect to the at least one other spring beam disposed on the opposite side of the first plate.

14. The electrostatic MEMS device of claim 10, wherein the seal is a metal alloy seal, further including a rigid standoff embedded within the metal alloy seal.

15. The electrostatic MEMS device of claim 10, further comprising:
electrical vias formed through a thickness of the second substrate; and
an electrostatic second plate formed on the second substrate.

16. The electrostatic MEMS device of claim 10, further comprising:
a plurality of holes formed through a thickness of the first plate, wherein the plurality of holes is disposed in at least one of the following ways: substantially along a latitudinal axis of the first plate, and in a close-packed hexagonal array.

17. The electrostatic MEMS device of claim 14, wherein the metal seal comprises:
an alloy of gold and indium which bonds the silicon-on-insulator substrate to the second substrate with a substantially hermetic seal around the MEMS device; and
wherein the rigid standoff within the metal seal determines the separation between the silicon-on-insulator substrate and the second substrate.

18. The electrostatic MEMS device of claim 10, wherein the first plate has at least one shunt bar, located substantially on a nodal line of a vibrational mode of the first plate.

19. The electrostatic MEMS device of claim 18, wherein the first plate has two shunt bars located each located substantially along one of two nodal lines of a vibrational mode of the first plate.

20. The electrostatic MEMS device of claim 15, wherein at least one via is electrically coupled to the plate by the seal, which is a metal alloy hermetic seal.

21. A method of operating the electrostatic MEMS device of claim 20, comprising:
applying a first voltage to the first plate formed on the silicon-on-insulator substrate;
applying a second voltage to the electrostatic second plate formed on the second substrate;
forming an electrical connection between the two electrical contacts by bending the first plate and shunt bars toward the electrical contacts in response to the applied voltages.

22. The method of claim 21, further comprising:
applying an input signal to one of the two contacts formed on the second substrate; and
obtaining an output signal from the other of the two electrical contact formed on the second substrate.

23. An apparatus for manufacturing an electrostatic MEMS device, comprising:
a silicon-on-insulator substrate including a silicon device layer, and insulating layer and a silicon handle layer
means for forming a first plate in the device layer of the silicon-on-insulator substrate and suspended adjacent to a the handle layer of the silicon-on-insulator substrate, wherein the first suspended plate is coupled to the silicon-on-insulator substrate by a plurality of spring beams;
means for forming at least one electrical contact on a second substrate, wherein the first plate is configured to move toward the at least one electrical contact; and
means for coupling the device layer of the silicon-on-insulator substrate to the second substrate with a seal that seals the MEMS device.

* * * * *